US012464911B2

(12) United States Patent
Sano

(10) Patent No.: US 12,464,911 B2
(45) Date of Patent: Nov. 4, 2025

(54) FLEXIBLE SUBSTRATE AND ELECTRONIC DEVICE

(71) Applicant: Magnolia White Corporation, Tokyo (JP)

(72) Inventor: Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 732 days.

(21) Appl. No.: 17/846,619

(22) Filed: Jun. 22, 2022

(65) Prior Publication Data

US 2022/0320259 A1 Oct. 6, 2022

Related U.S. Application Data

(63) Continuation of application No. PCT/JP2020/039174, filed on Oct. 16, 2020.

(30) Foreign Application Priority Data

Dec. 26, 2019 (JP) ................. 2019-236284

(51) Int. Cl.
*H01L 27/32* (2006.01)
*H10K 59/131* (2023.01)
*H10K 77/10* (2023.01)

(52) U.S. Cl.
CPC ......... *H10K 59/131* (2023.02); *H10K 77/111* (2023.02)

(58) Field of Classification Search
CPC ........................... H10K 59/131; H10K 77/111
USPC ....................................................... 174/254
See application file for complete search history.

(56) References Cited

U.S. PATENT DOCUMENTS

| 2010/0033666 | A1  | 2/2010  | Akiyama et al. |
| 2014/0041999 | A1  | 2/2014  | Yim et al. |
| 2015/0282296 | A1  | 10/2015 | Ogura et al. |
| 2016/0254275 | A1* | 9/2016  | Feng .................... H10D 86/441 257/72 |

(Continued)

FOREIGN PATENT DOCUMENTS

| JP | 2002-215059 A | 7/2002 |
| JP | 2003-322864 A | 11/2003 |

(Continued)

OTHER PUBLICATIONS

International Search Report issued in International Patent Application No. PCT/JP2020/039174 on Dec. 15, 2020 and English translation of same. 6 pages.

(Continued)

*Primary Examiner* — Tremesha W Burns
(74) *Attorney, Agent, or Firm* — K&L Gates LLP

(57) ABSTRACT

According to one embodiment, a flexible substrate includes a first insulating basement, which includes an island-shaped portion, a bridge portion, and an extending portion. The island-shaped portion includes a first island-shaped portion and a second island-shaped portion. The bridge portion extends in a first direction and connects the first island-shaped portion with the second island-shaped portion. The extending portion includes a first extending portion connected to the first island-shaped portion and extending in a second direction, and a second extending portion connected to the bridge portion and extending in the second direction.

1 Claim, 16 Drawing Sheets

(56) References Cited

U.S. PATENT DOCUMENTS

2017/0003440 A1    1/2017   Kim et al.
2017/0288005 A1   10/2017   Kawata
2021/0013431 A1    1/2021   Kawata et al.

FOREIGN PATENT DOCUMENTS

| | | |
|---|---|---|
| JP | 2010-197496 A | 9/2010 |
| JP | 2015-148942 A | 8/2015 |
| JP | 2015-198102 A | 11/2015 |
| JP | 2019-175924 A | 10/2019 |
| JP | 2019-194989 A | 11/2019 |
| WO | WO2008/032647 A1 | 3/2008 |

OTHER PUBLICATIONS

Written Opinion issued in International Patent Application No. PCT/JP2020/039174 on Dec. 15, 2020. 3 pages.

\* cited by examiner

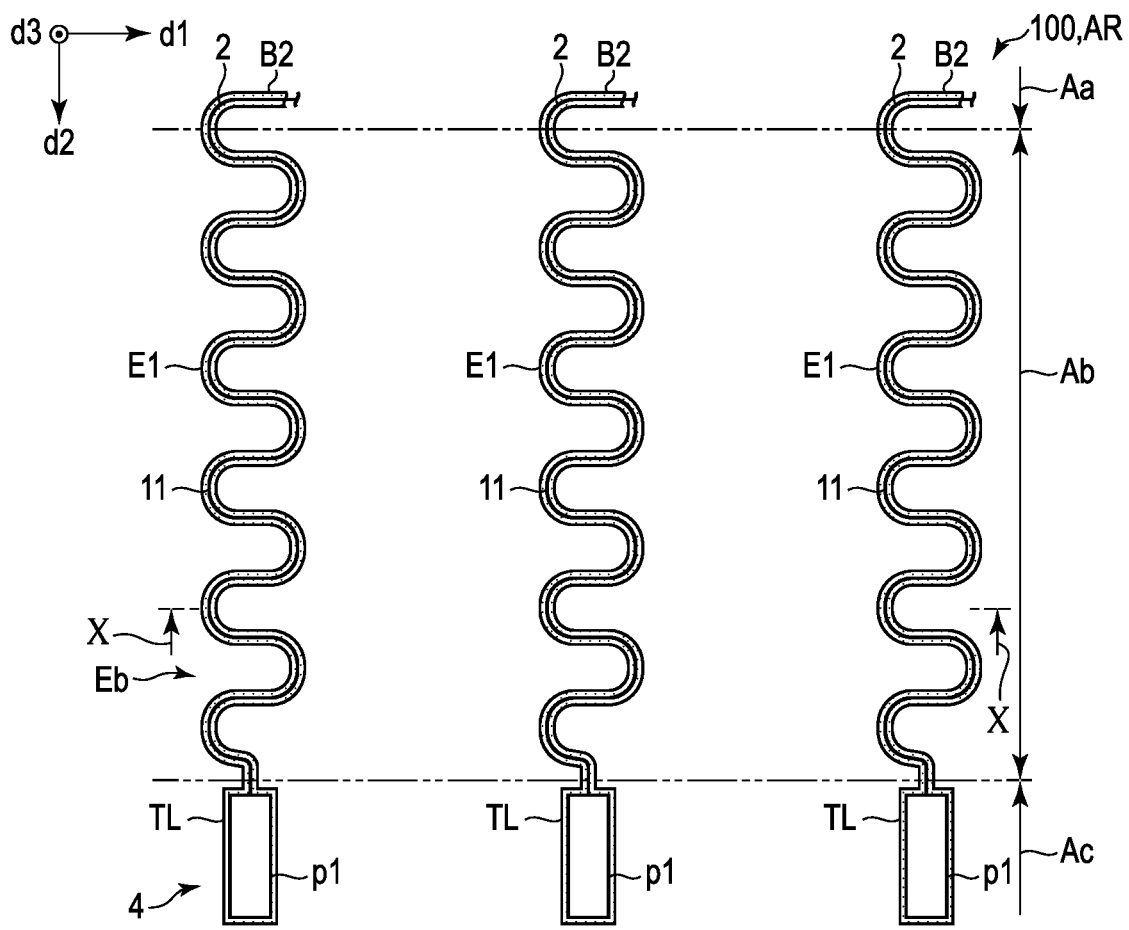
F I G. 9
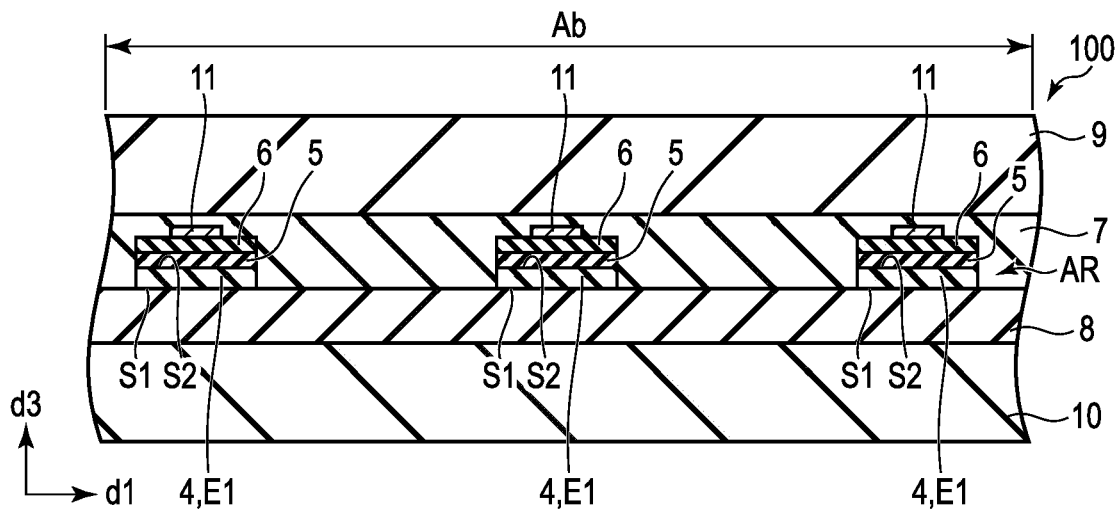
F I G. 10

|  |  | Condition 1 (sample 1) | Condition 2 (sample 2) |
|---|---|---|---|
| Wiring density | Area Aa | 0.17 $\mu m^2/\mu m$ | 0.33 $\mu m^2/\mu m$ |
|  | Area Ab | 0.14 $\mu m^2/\mu m$ | 0.18 $\mu m^2/\mu m$ |
| Ratio difference |  | 17% | 45% |

F I G. 11

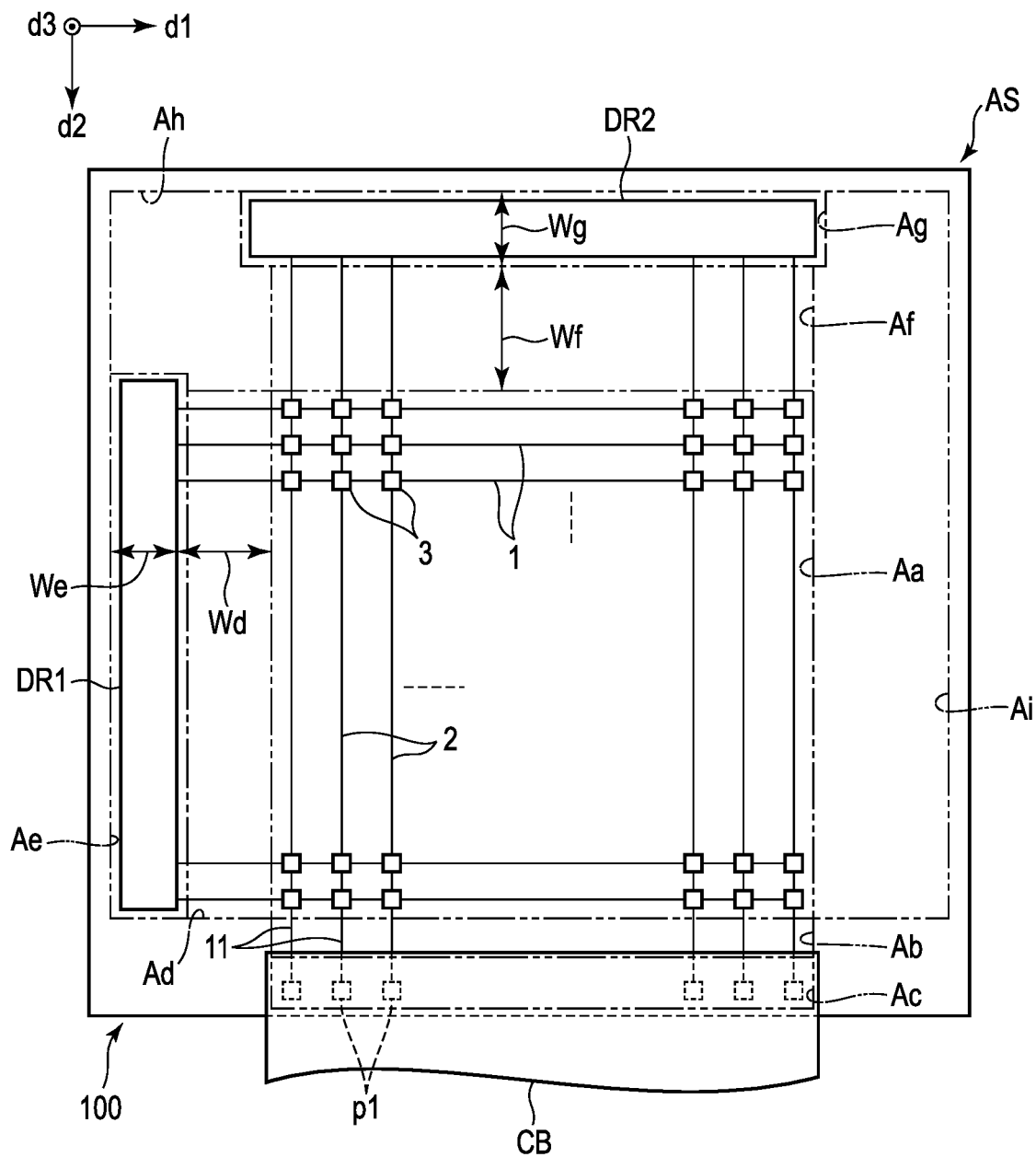
F I G. 12

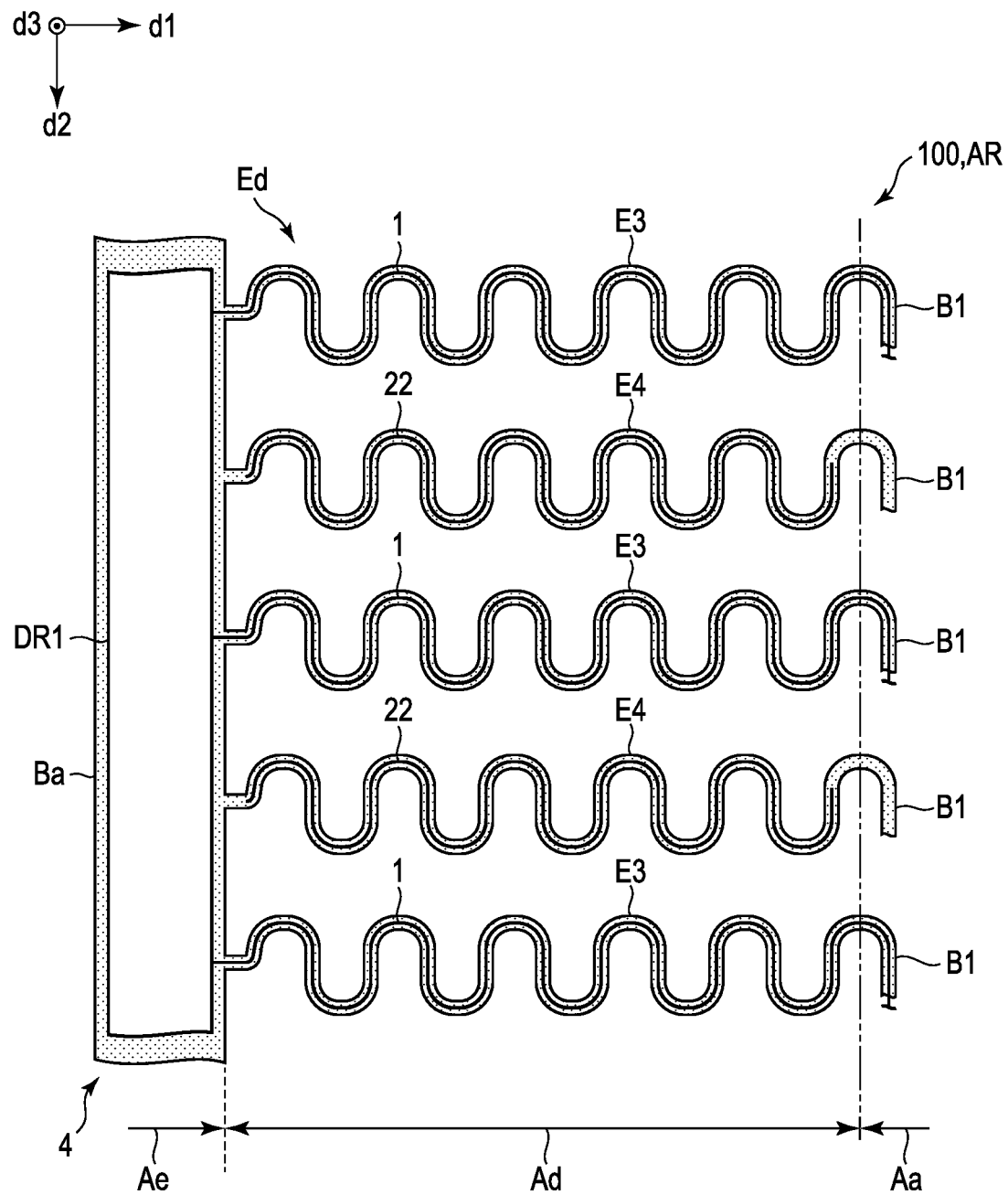
F I G. 13

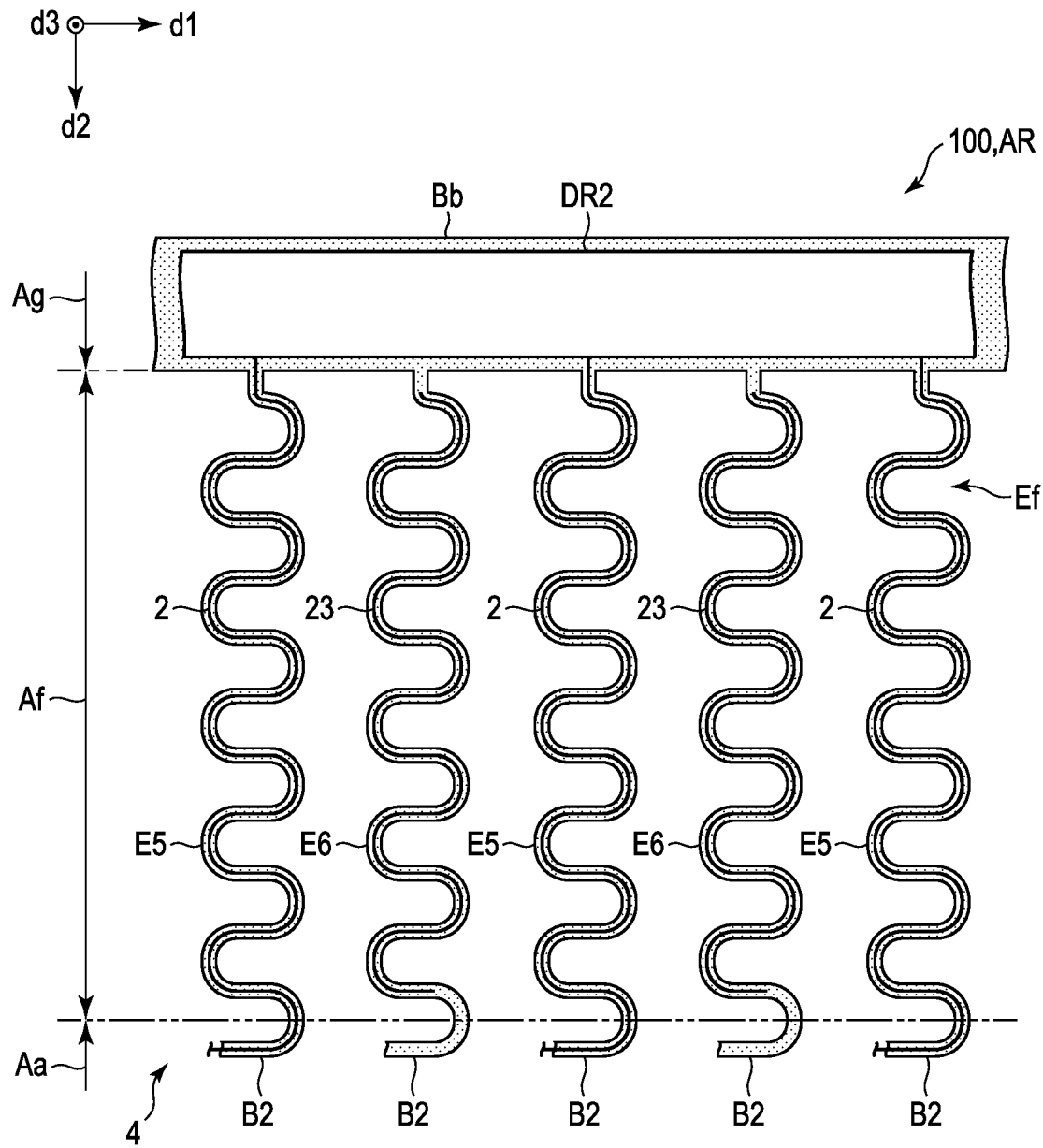
F I G. 14

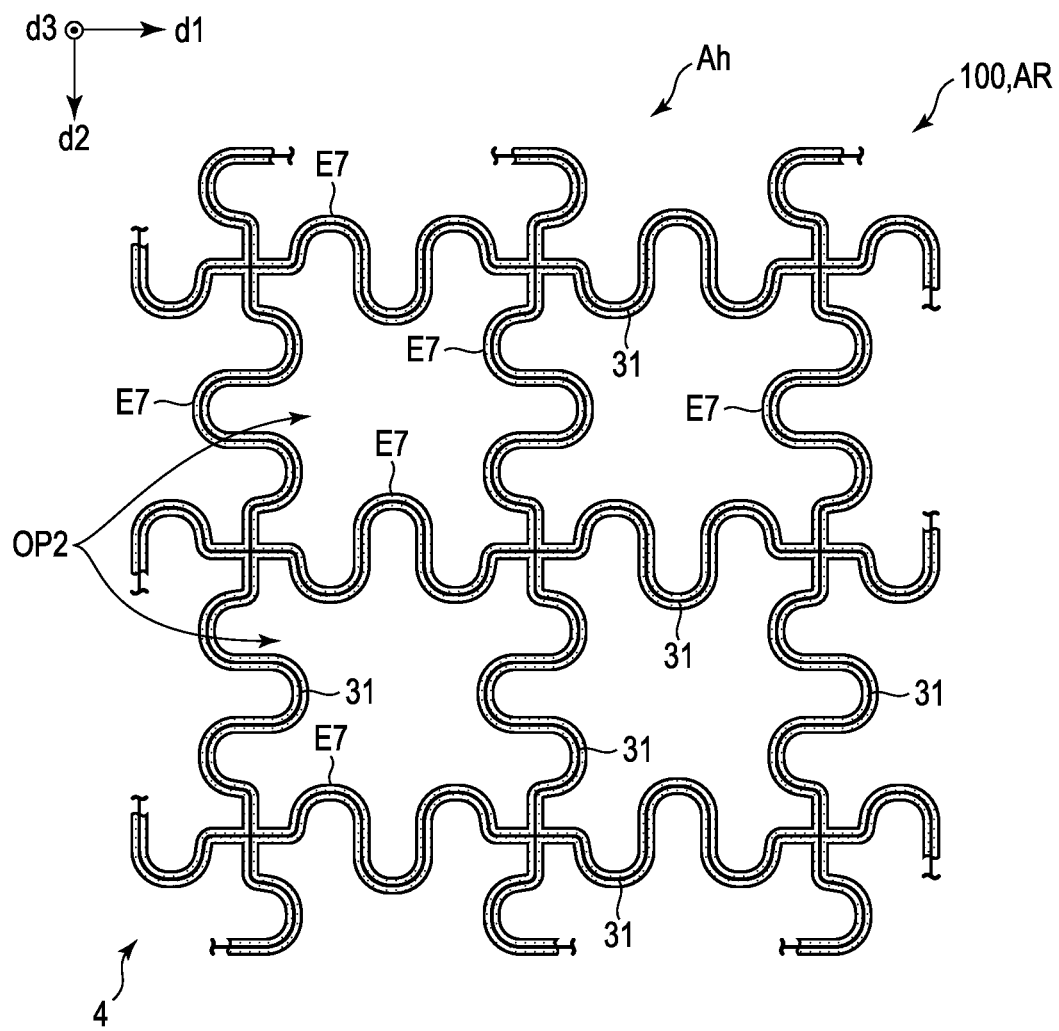
F I G. 15

FLEXIBLE SUBSTRATE AND ELECTRONIC DEVICE

CROSS-REFERENCE TO RELATED APPLICATIONS

This application is a Continuation Application of PCT Application No. PCT/JP2020/039174, filed Oct. 16, 2020 and based upon and claiming the benefit of priority from Japanese Patent Application No. 2019-236284, filed Dec. 26, 2019, the entire contents of all of which are incorporated herein by reference.

FIELD

Embodiments described herein relate generally to a flexible substrate and an electronic device.

BACKGROUND

In recent years, the use of flexible substrates with flexibility and elasticity has been studied in various fields. For example, attachment of a flexible substrate with electric elements arrayed in a matrix, to a curved surface of a housing of an electronic device, a human body, or the like has been considered. For example, various sensors such as touch sensors and temperature sensors, and display elements can be applied as electric elements.

In a flexible substrate, it is necessary to take measures to prevent the wiring lines from being damaged by stress caused by flexing and stretching. As such measures, for example, providing a honeycomb-shaped opening in a basement which supports the wiring lines and forming the wiring lines in a shape of meandering (meander shape) have been proposed.

BRIEF DESCRIPTION OF THE DRAWINGS

FIG. 9 is an enlarged plan view showing a lower side of a flexible substrate according to a comparative example 1, illustrating a plurality of extending portions, a plurality of island-shaped portions, a plurality of routing lines, and a plurality of pads.

FIG. 10 is a cross-sectional view showing a part of the flexible substrate as viewed along line X-X in FIG. 9.

FIG. 11 is a table showing a wiring density and a ratio difference according to conditions of the flexible substrate according to the comparative example 1.

FIG. 12 is a plan view showing an electronic device according to a second embodiment.

FIG. 13 is an enlarged plan view showing a left side of a flexible substrate shown in FIG. 12, illustrating a plurality of extending portions, a strip-shaped portion, a plurality of scanning lines, a plurality of dummy lines, and a scanning line driver.

FIG. 14 is an enlarged plan view showing an upper side of the flexible substrate shown in FIG. 12, illustrating a plurality of extending portions, a strip-shaped portion, a plurality of signal lines, a plurality of dummy lines, and a signal line driver.

FIG. 15 is an enlarged plan view showing an upper left corner side of the flexible substrate shown in FIG. 12, illustrating a plurality of extending portions and a plurality of wiring lines.

DETAILED DESCRIPTION

Figure 1:
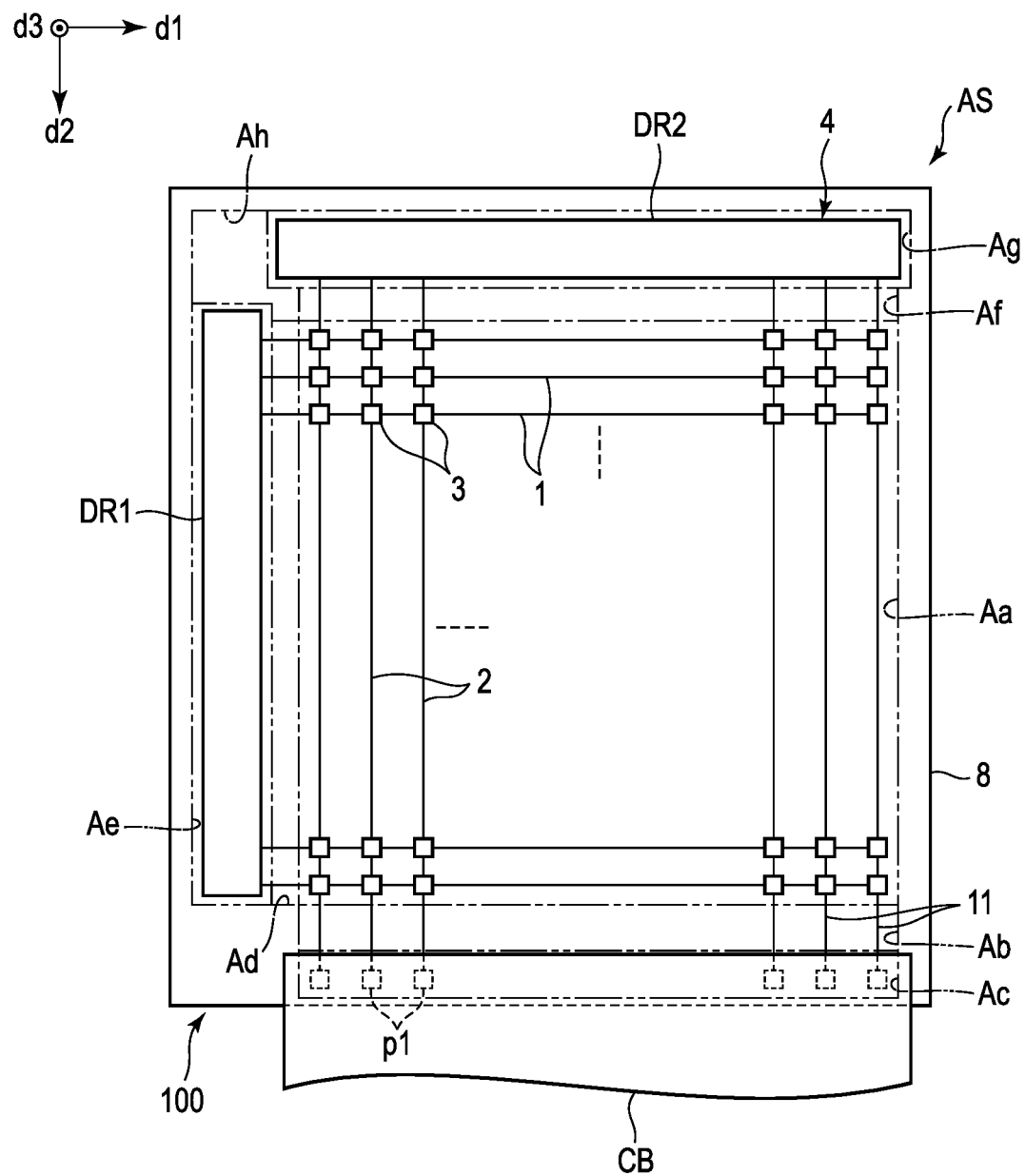
FIG. 1 is a plan view showing an electronic device according to a first embodiment.

In general, according to one embodiment, there is provided a flexible substrate comprising a first insulating basement including: an island-shaped portion; a bridge portion; and an extending portion. The island-shaped portion includes a first island-shaped portion and a second island-shaped portion disposed parallel to the first island-shaped portion in a first direction. The bridge portion extends in the first direction and connects the first island-shaped portion with the second island-shaped portion. The extending portion includes a first extending portion which is connected to the first island-shaped portion and extends in a second direction intersecting the first direction, and a second extending portion which is connected to the bridge portion and extends in the second direction.

According to another embodiment, there is provided an electronic device comprising: a flexible substrate; and a wiring substrate. The flexible substrate comprises: a first insulating basement including an island-shaped portion, a bridge portion, and an extending portion; and a routing line provided on the first insulating basement and extending in the second line. The island-shaped portion includes a first island-shaped portion and a second island-shaped portion disposed parallel to the first island-shaped portion in a first direction. The bridge portion extends in the first direction and connects the first island-shaped portion with the second island-shaped portion. The extending portion includes a first extending portion which is connected to the first island-shaped portion and extends in a second direction intersecting the first direction, and a second extending portion which is connected to the bridge portion and extends in the second direction. The first insulating basement includes a peripheral portion. The first extending portion is connected to the peripheral portion. The peripheral portion is a terminal portion. The routing line is provided on the first extending portion and is connected to a pad formed on the terminal portion. The wiring substrate is mounted on the terminal portion. The wiring substrate includes a second insulating basement, a lead line, and a second pad electrically connected to the lead line. The flexible substrate and the wiring substrate are connected to each other via a connecting material. The second insulating basement is formed of a material having a lower coefficient of elasticity than the first insulating basement.

Each of embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

First, a first embodiment will be described. FIG. 1 is a plan view showing an electronic device AS according to the first embodiment.

As shown in FIG. 1, the electronic device AS comprises a flexible substrate 100 and a wiring substrate CB. In this embodiment, a first direction d1, a second direction d2, and a third direction d3 are defined. The first direction d1 and the second direction d2 are directions which are parallel to a main surface of the flexible substrate 100 and which intersect with each other. The third direction d3 is a direction perpendicular to the first direction d1 and the second direction d2, and corresponds to a thickness direction of the flexible substrate 100. The first direction d1 and the second direction d2 are orthogonal to each other in this embodiment, but may intersect at an angle other than 90 degrees.

As described herein, "a second member above/on a first member" and "a second member below/under a first member" indicate that the second member may be in contact with the first member or may be located remote from the first member. In the latter case, a third member may be interposed between the first member and the second member.

The flexible substrate 100 includes an insulating basement 4, a plurality of wiring lines, a plurality of electric elements 3, a plurality of driving circuits, and a plurality of pads p1. In this embodiment, examples of the plurality of wiring lines include a plurality of scanning lines 1, a plurality of signal lines 2, and a plurality of routing lines 11. Examples of the plurality of driving circuits include a scanning line driver DR1 and a signal line driver DR2.

The flexible substrate 100 includes an area Aa, an area Ab, an area Ac, an area Ad, an area Ae, an area Af, an area Ag, and an area Ah. Each of the areas is located continuously with an adjacent area. For example, the area Ab is continuous from the area Aa, and the area Ac is continuous from the area Ab. In addition, the area Ad is continuous from the area Aa, and the area Ae is continuous from the area Ad. Furthermore, the area Af is continuous from the area Aa, and the area Ag is continuous from the area Af. The area Ab is located between the area Aa and the area Ac in the second direction d2. In addition, the area Ad is located between the area Aa and the area Ae in the first direction d1. Furthermore, the area Af is located between the area Aa and the area Ag in the second direction d2. In this embodiment, the area Aa is a first area, the area Ab is a second area, and the area Ac is a third area.

The area Ah is continuous from the areas Ad, Ae, Af, and Ag. In the example shown in FIG. 1, the area Ah is located in an upper left corner of the flexible substrate 100.

The scanning line 1, the signal line 2, the electric element 3, the routing line 11, the scanning line driver DR1, and the signal line driver DR2 are located on the insulating basement 4.

The plurality of scanning lines 1 extend in the first direction d1 and are arranged in the second direction d2. In other words, the plurality of scanning lines 1 are located in the areas Aa and Ad. Each of the plurality of scanning lines 1 is connected to the scanning line driver DR1 located in the area Ae.

The plurality of signal lines 2 extend in the second direction d2 and are arranged in the first direction d1. In other words, the plurality of signal lines 2 are located in the areas Aa and Af. Each of the plurality of signal lines 2 is connected to the signal line driver DR2 located in the area Ag.

Each of the plurality of electric elements 3 is electrically connected to the scanning line 1 and the signal line 2, and is located at an intersection of the scanning line 1 and the signal line 2 in the area Aa. In this embodiment, the plurality of electric elements 3 are arrayed in a matrix in the first direction d1 and the second direction d2. Details of a function of the electric element 3 will be described later. The area Aa is an area in which the plurality of electric elements 3 are disposed. The plurality of scanning lines 1 and the plurality of signal lines 2 are provided in a grating pattern in the first direction d1 and the second direction d2 in the area Aa.

The plurality of routing lines 11 extend in the second direction d2 and are arranged at intervals in the first direction d1. The plurality of routing lines 11 are located in the area Ab and extend from the area Aa toward the area Ac. The plurality of routing lines 11 are electrically connected to a corresponding line among the plurality of wiring lines. In this embodiment, the plurality of routing lines 11 are electrically connected to the plurality of scanning lines 1 and a corresponding signal line 2 among the plurality of signal lines 2.

The plurality of pads p1 are arranged at intervals in the first direction d1 in the area Ac. Each of the plurality of pads p1 is electrically connected to a corresponding routing line 11 among the plurality of routing lines 11.

The wiring substrate CB is overlapped with the area Ac of the flexible substrate 100 and coupled to the flexible substrate 100. The wiring substrate CB is electrically connected to the plurality of pads p1 and physically fixed to the flexible substrate 100. The wiring substrate CB is a printed circuit substrate. In this embodiment, the wiring substrate CB is composed of a flexible printed circuit (FPC).

Figure 2:
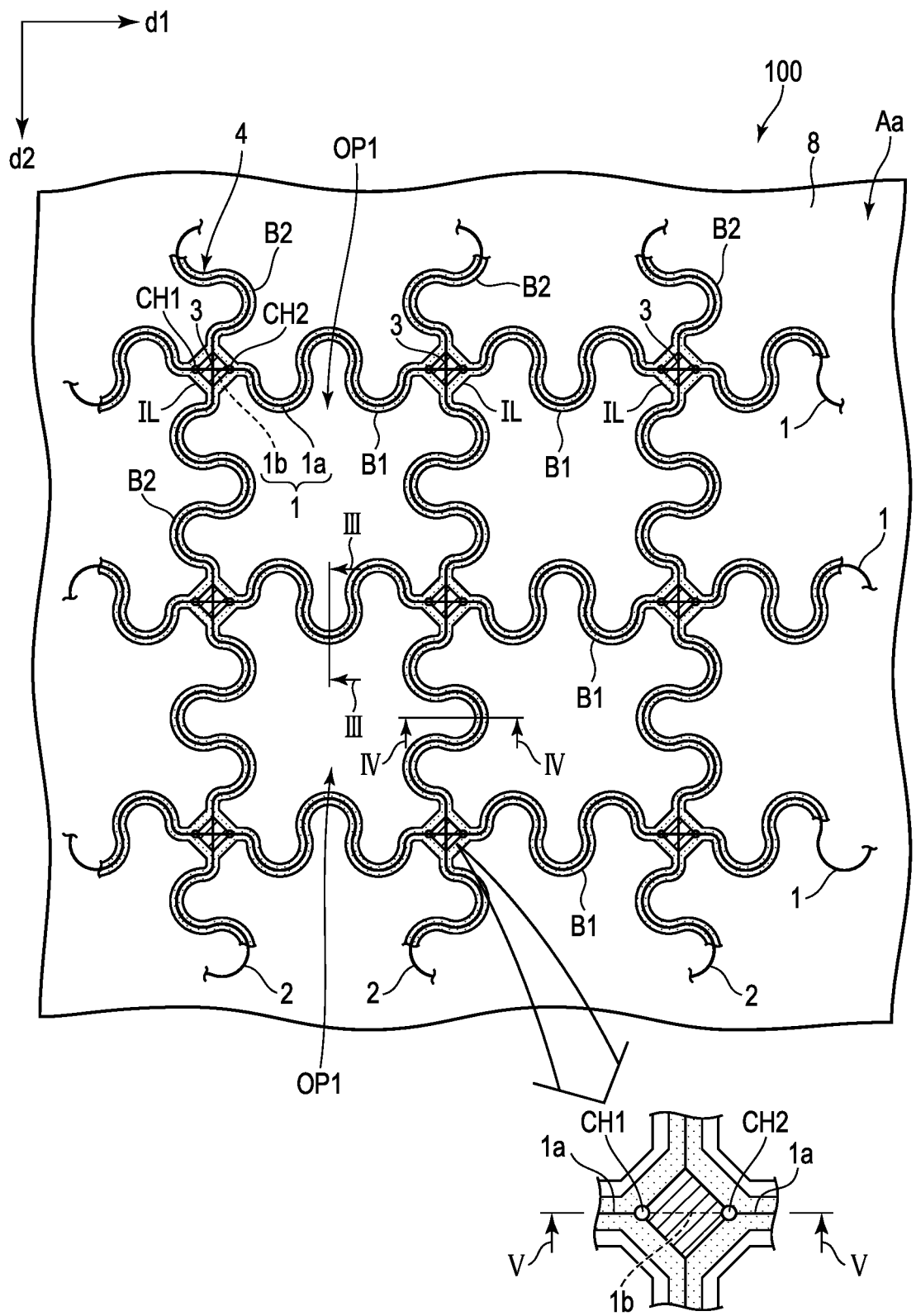
FIG. 2 is an enlarged plan view showing a part of a flexible substrate shown in FIG. 1.

FIG. 2 is an enlarged plan view showing a part of the flexible substrate 100 shown in FIG. 1. As shown in FIG. 2, the flexible substrate 100 comprises an insulating basement 4 formed along the scanning lines 1, the signal lines 2, and the like. The insulating basement 4 has elasticity and flexibility. The insulating basement 4 is formed of, for example, polyimide, but is not limited to this example and may be formed of the other insulating material.

The insulating basement 4 includes a plurality of island-shaped portions IL, a plurality of bridge portions B1, and a plurality of bridge portions B2 in the area Aa. The plurality of island-shaped portions IL, bridge portions B1, and bridge portions B2 are integrally formed. The plurality of island-shaped portions IL are arranged at intervals from each other. In this embodiment, the plurality of island-shaped portions IL are arrayed in a matrix in the first direction d1 and the second direction d2. The island-shaped portions IL function as first island-shaped portions.

The plurality of bridge portions B1 are located in the area Aa, extend in the first direction d1, and are arranged at intervals in the second direction d2. Each of the bridge portions B1 has a corrugated shape in planar view. Each of the bridge portions B1 connects two island-shaped portions IL adjacent to each other in the first direction d1. The bridge portion B1 is provided to extensibly connect two island-shaped portions IL, and does not linearly connect the two island-shaped portions IL at the shortest distance.

The plurality of bridge portions B2 are located in the area Aa, extend in the second direction d2, and are arranged at intervals in the first direction d1. Each of the bridge portions B2 has a corrugated shape in planar view. Each of the bridge portions B2 connects two island-shaped portions IL adjacent to each other in the second direction d2. Similarly to the plurality of bridge portions B1, the plurality of bridge portions B2 are provided to extensibly connect two island-shaped portions IL adjacent to each other in the second direction d2, and does not linearly connect the two island-shaped portions IL at the shortest distance.

The flexible substrate 100 includes a first portion OP1 surrounded by the plurality of island-shaped portions IL and the plurality of bridge portions B1 and B2. In this embodiment, each first portion OP1 is surrounded by a pair of bridge portions B1 adjacent to each other in the second direction d2, a pair of bridge portions B2 adjacent to each other in the first direction d1, and four island-shaped portions IL connected to the pair of bridge portions B1 and the pair of bridge portions B2. The plurality of first openings OP1 are arrayed in a matrix in the first direction d1 and the second direction d2. The insulating basement 4 is not formed in this first portion OP1.

The scanning lines 1 are located on the plurality of bridge portions B1 and the plurality of island-shaped portions IL continuous in the first direction d1, and extend along the plurality of bridge portions B1 and the plurality of island-shaped portions IL. In this embodiment, the scanning line 1 has a corrugated shape in planar view. The signal lines 2 are located on the plurality of bridge portions B2 and the plurality of island-shaped portions IL continuous in the second direction d2, and extend along the plurality of bridge portions B2 and the plurality of island-shaped portions IL. In this embodiment, the signal line 2 has a corrugated shape in planar view.

The scanning lines 1 and the signal lines 2 are examples of wiring lines which the flexible substrate 100 comprises. The scanning lines 1 and the signal lines 2 can be formed of, for example, a metal material or a transparent conductive material and may have a single-layer structure or a multi-layer structure. In addition to the scanning lines 1 and the signal lines 2, the flexible substrate 100 may comprise other types of wiring lines such as power supply lines that supply power to the electric elements 3.

In this embodiment, each of the bridge portions B1 and B2, the scanning lines 1, and the signal lines 2 is curved to extend. However, as will be described later with reference to FIG. 21, the bridge portions B1 and B2 may be curved to extend. In this case, the scanning lines 1 and the signal lines 2 are also curved to extend.

The scanning line 1 includes a first portion 1a represented by a solid line and a second portion 1b represented by a dashed line. The second portion 1b overlaps with the electric element 3. The first portion 1a and the second portion 1b are disposed in layers different from each other, and are electrically connected to each other through the contact hole CH1 and the contact hole CH2.

The electric element 3 is electrically connected to a corresponding wiring line among the plurality of wiring lines. In this embodiment, the electric element 3 is electrically connected to one scanning line 1 and one signal line 2.

The scanning line 1 supplies a scanning signal to the electric element 3. For example, when the electric element 3 is accompanied by the output of a signal such as a sensor, the output signal from the electric element 3 is supplied to the signal line 2. In addition, for example, when the electric element 3 operates in response to an input signal such as a light emitting element or an actuator, a drive signal is supplied to the signal line 2. A controller including a scanning signal supply source, a drive signal supply source, a processor for processing an output signal, and the like may be provided on the flexible substrate 100 or may be provided on a device connected to the flexible substrate 100.

The electric element 3 is located on the island-shaped portion IL. The electric element 3 is smaller than the island-shaped portion IL, and is provided such that the entire electric element 3 is located on the island-shaped portion IL in FIG. 2. For example, the electric element 3 is a sensor, a semiconductor element, an actuator, or the like. For example, the electric element serving as a sensor can be applied to an optical sensor that receives visible light or near-infrared light, a temperature sensor, a pressure sensor, a touch sensor, or the like. In this case, the area Aa is a sensing area. For example, the electric element serving as a semiconductor element can be applied to a light emitting element, a light receiving element, a diode, a transistor and the like.

When the electric element 3 is a light emitting element, a flexible display having flexibility and elasticity can be realized. As the electric element serving as a light emitting element, for example, a light emitting diode such as a mini LED or a micro LED in a size having a side which is approximately 100 μm long, or an organic electroluminescent element can be used. In this case, the area Aa is a display area.

When the electric element 3 is an actuator, for example, a piezo element can be applied. The electric element 3 is not limited to the examples mentioned above, and other elements comprising various functions can also be applied. The electric element 3 may be a capacitor, a resistor, or the like. In addition, the arrangement position and shape of the electric element 3 are not limited to the example shown in FIG. 2. Based on the above, the area Aa functions as an active area such as a sensing area or a display area.

Figure 3:
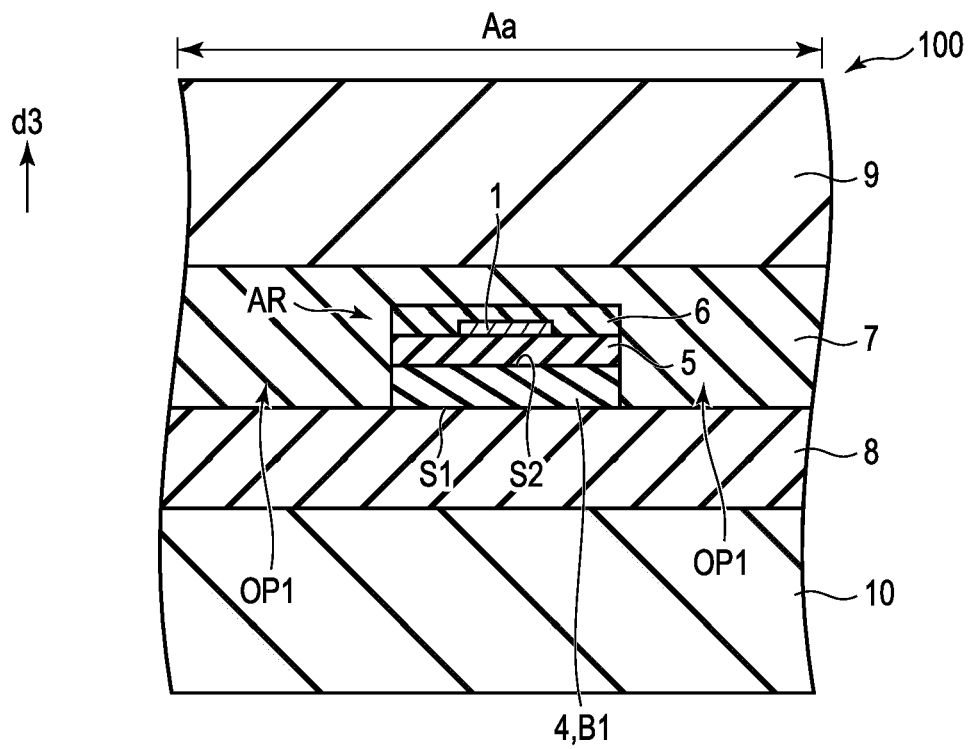
FIG. 3 is a cross-sectional view showing a part of the flexible substrate as viewed along line III-III in FIG. 2.

FIG. 3 is a cross-sectional view showing a part of the flexible substrate 100 as viewed along line III-III in FIG. 2.

As shown in FIG. 3, the flexible substrate 100 further comprises an organic insulating layer 5, an organic insulating layer 6, an organic insulating layer 7, an organic insulating layer 9, and an organic insulating layer 10. The insulating basement 4 includes a first surface S1 and a second surface S2 on a side opposite to the first surface S1. The bridge portion B1 constitutes a part of the first surface S1 and a part of the second surface S2. The organic insulating layer 5 covers the second surface S2 of the insulating basement 4.

The scanning line 1 is provided on the side of the second surface S2 of the insulating basement 4. More specifically, the scanning line 1 is disposed on the organic insulating layer 5. In this embodiment, the scanning line 1 is formed of TAT. The TAT has a three-layer laminated structure (Ti-based/Al-based/Ti-based) and includes a lower layer formed of titanium (Ti) or a metal material containing Ti as a main component such as an alloy containing Ti, a middle layer formed of aluminum (Al) or a metal material containing Al as a main component such as an alloy containing Al, and an upper layer formed of Ti or a metal material containing Ti as a main component such as an alloy containing Ti.

The organic insulating layer 6 covers the scanning line 1 and the organic insulating layer 5. The organic insulating layer 5 and the organic insulating layer 6 are formed of an organic material such as polyimide. The organic insulating layers 5 and 6 are provided only directly above the insulating basement 4 (island-shaped portions IL1, bridge portions B1 and B2, and the like), but may be provided in the areas where the insulating basement 4 is not present (i.e., the areas overlapping the first portions OP1, or the like). From the viewpoint of the flexibility and elasticity of the flexible substrate 100, however, the arrangement mode as shown in FIG. 3 is desirable. In addition, the signal line 2 is not disposed on the bridge portion B1 in the example shown in FIG. 3. The insulating basement 4, the organic insulating layer 5, the organic insulating layer 6, the scanning line 1, and the like constitute an array substrate AR.

The organic insulating layer 7 is opposed to the second surface S2 of the insulating basement 4 and is closely adhered to the array substrate AR. The organic insulating layer 7 covers the insulating basement 4, the organic insulating layer 5, and the organic insulating layer 6. The organic insulating layer 8 is opposed to the first surface S1 of the insulating basement 4 and is closely adhered to the array substrate AR. The organic insulating layer 7 and the organic insulating layer 8 are closely adhered to each other through the plurality of first portions OP1. In other words, the organic insulating layer 7 is in contact with the organic insulating layer 8 in the portion surrounded by the plurality of bridge portions B1 and B2. The organic insulating layer 7 is located between the array substrate AR and the organic insulating layer 9. The organic insulating layer 9 is closely adhered to the organic insulating layer 7. The organic insulating layer 8 is located between the array substrate AR and the organic insulating layer 10. The organic insulating layer 10 is closely adhered to the organic insulating layer 8.

The organic insulating layers 7 to 10 are formed of an organic material having more flexibility than the insulating basement 4.

Figure 4:
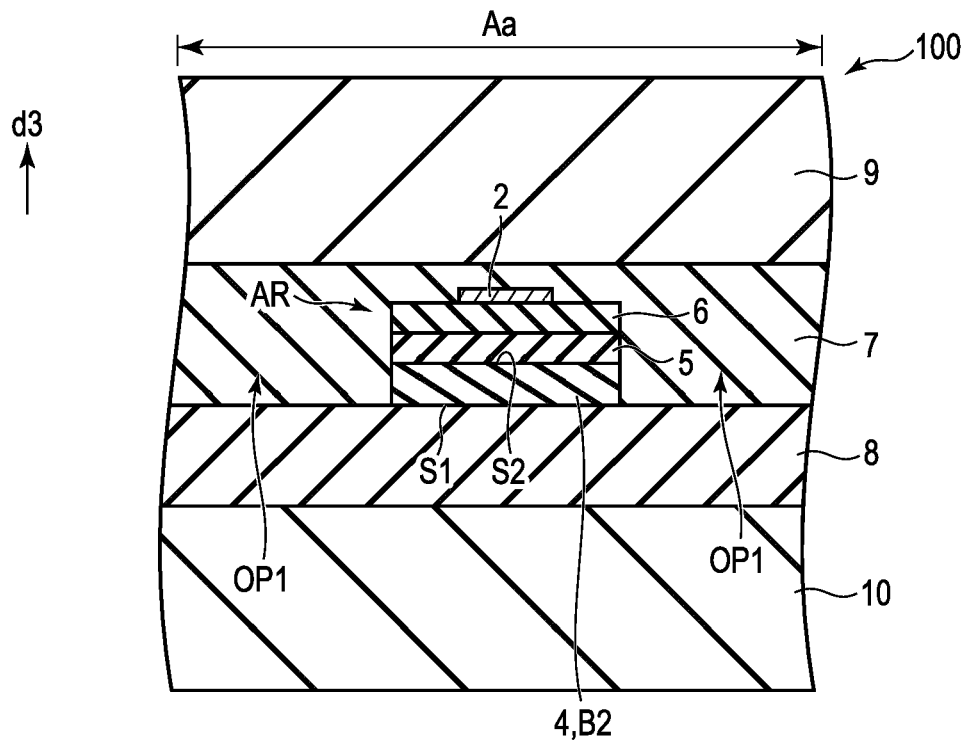
FIG. 4 is a cross-sectional view showing a part of the flexible substrate as viewed along line IV-IV in FIG. 2.

FIG. 4 is a cross-sectional view showing a part of the flexible substrate 100 as viewed along line IV-IV in FIG. 2.

As shown in FIG. 4, the bridge portion B2 constitutes a part of the first surface S1 and a part of the second surface S2. The signal line 2 is provided on the side of the second surface S2 of the insulating basement 4. More specifically, the signal line 2 is disposed on the organic insulating layer 6. In this embodiment, the signal line 2 is formed of TAT. The organic insulating layer 7 covers the insulating basement 4, the organic insulating layer 5, the organic insulating layer 6, and the signal line 2. In the example shown in FIG. 4, the scanning line 1 is not disposed on the bridge portion B2. As shown in FIG. 3 and FIG. 4, the insulating basement 4, the organic insulating layer 5, the scanning line 1, the organic insulating layer 6, and the signal line 2 are surrounded by the organic insulating layers 7 and 8 on the upper, lower, right, and left sides. The signal line 2 also constitutes the array substrate AR.

Figure 5:
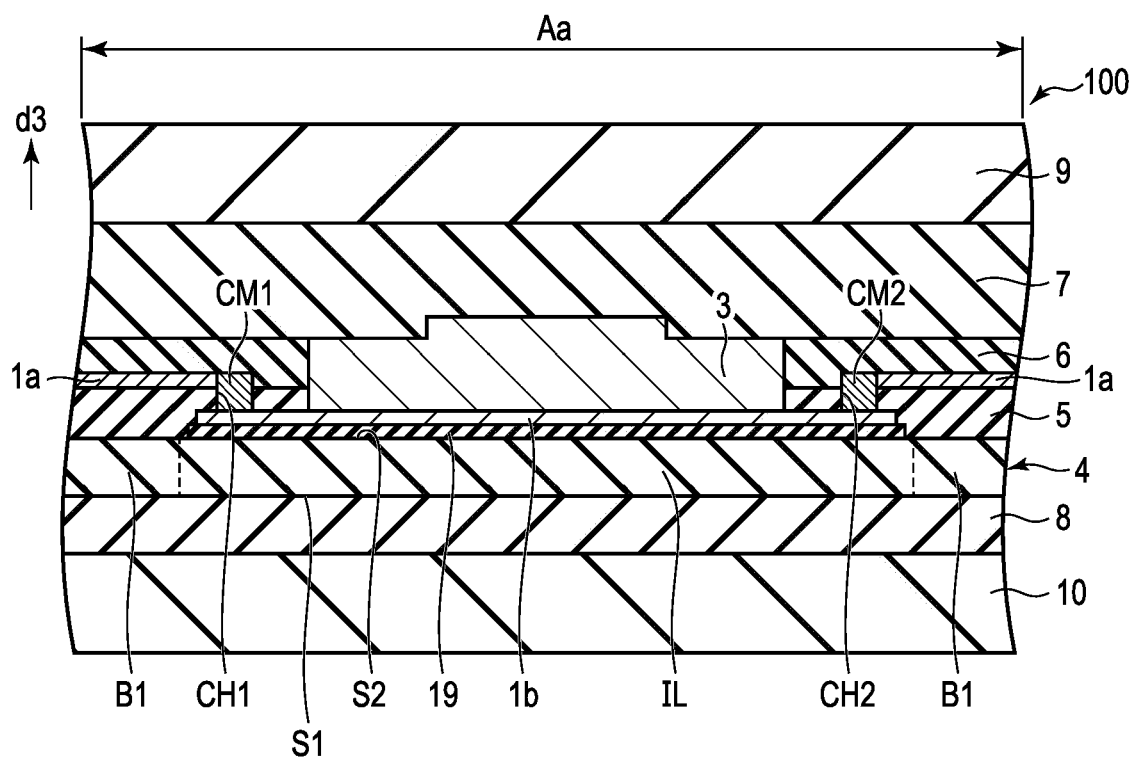
FIG. 5 is a cross-sectional view showing a part of the flexible substrate as viewed along line V-V in FIG. 2.

FIG. 5 is a cross-sectional view showing a part of the flexible substrate 100 as viewed along line V-V in FIG. 2. As shown in FIG. 5, the island-shaped portion IL constitutes a part of the first surface S1 and a part of the second surface S2. The electric element 3 is provided on the second surface S2 side of the corresponding island-shaped portion IL among the plurality of island-shaped portions IL of the insulating basement 4.

An inorganic insulating layer 19 (passivation layer) is disposed between the electric element 3 and the island-shaped portion IL. The inorganic insulating layer 19 is formed in an island shape which overlaps with the electric element 3 (or the island-shaped portion IL) in planar view. The first portions 1a are disposed on the organic insulating layer 5 and are covered with the organic insulating layer 6. The second portion 1b is disposed on the inorganic insulating layer 19 and is electrically connected to the electric element 3. In the example shown in FIG. 5, both ends of the second portion 1b are covered with the organic insulating layer 5.

The contact holes CH1 and CH2 are formed in the organic insulating layer 5. In the figure, one of the first portions 1a is electrically connected to the second portion 1b via a connecting member CM1 disposed in the contact hole CH1. The other first portion 1a is electrically connected to the second portion 1b via a connecting member CM2 disposed in the contact hole CH2. Each of the connecting members CM1 and CM2 may be a part of the first portion 1a or may be provided separately from the first portion 1a.

Thus, the island-shaped inorganic insulating layer 19 is disposed between the electric element 3 and the insulating basement 4. The inorganic insulating layer 19 functions as a protective layer that suppresses infiltration of moisture and the like into the electric element 3 and the second portion 1b of the scanning line 1. For this reason, the reliability of the flexible substrate 100 can be improved. In addition, in general, crack is more likely to occur in the inorganic film than in the organic film but, since the inorganic insulating layer 19 is not provided below the first portions 1a of the scanning line 1, breakage of the scanning line 1 at the first portions 1a can be suppressed. The above matter is also applied to the signal line 2. Furthermore, the elasticity and flexibility of the flexible substrate 100 can hardly be impaired as compared with a case where the inorganic insulating layer 19 is provided on the entire flexible substrate 100.

In addition, in the scanning line 1, the second portion 1b which overlaps with the electric element 3 is disposed in a layer different from that of the first portions 1a. For this reason, the degree of freedom in designing the array substrate AR can be improved in the vicinity of the electric element 3. In addition, the contact holes CH1 and CH2 are provided above the inorganic insulating layer 19. Since the first portions 1a and the second portion 1b are connected above the inorganic insulating layer 19, connection failure between the first portions 1a and the second portion 1b can be suppressed. The island-shaped portion IL1 of the insulating basement 4 is disposed below the electric element 3. The electric element 3 can be thereby desirably supported.

The inorganic insulating layer 19, the connecting members CM1 and CM2, and the electric element 3 also constitute the array substrate AR.

Next, the organic insulating layers 7 to 10 shown in FIG. 1 to FIG. 5 will be described in detail.

As shown in FIG. 1 and FIG. 3, the organic insulating layers 8 and 10 are located on substantially the entire surface of the flexible substrate 100, and the organic insulating layers 8 and 10 have the same shape and size, in planar view. The organic insulating layers 7 and 9 have substantially the same shape and size as the organic insulating layers 8 and 10, but are not located in the area Ac.

As shown in FIG. 3, the organic insulating layers 7 to 10 have elasticity and flexibility. Each of the organic insulating layers 7 to 10 is formed of a material having a lower coefficient of elasticity than the insulating basement 4. Examples of the elastic material (organic insulating material) forming the organic insulating layers 7 to 10 include any one of acrylic, urethane, and epoxy resins. In this embodiment, the organic insulating layers 7 to 10 are formed of the same material.

The organic insulating layer 7 functions as a protective layer that protects the scanning lines 1, the signal lines 2, the electric elements 3, and the like. In addition, the organic insulating layer 7 functions as a flattening layer which flattens the organic insulating layer 9 side of the flexible substrate 100. Furthermore, the organic insulating layer 7 functions as an adhesion layer, and the organic insulating layer 7 can be desirably brought into close contact with the array substrate AR.

The organic insulating layer 9 functions as a support layer which supports the array substrate AR. For this reason, the risk that may occur during the manufacturing process and handling can be reduced by laminating the organic insulating layer 7 and the organic insulating layer 9 on the array substrate AR.

Each of the organic insulating layers 8 and 10 functions as a support layer which supports the insulating basement 4. For this reason, the strength of the flexible substrate 100 can be increased as a whole, and the infiltration of moisture and the like from below can be suppressed. In addition, the risk that may occur during handling can be further reduced by adding the organic insulating layers 8 and 10.

Figure 6:
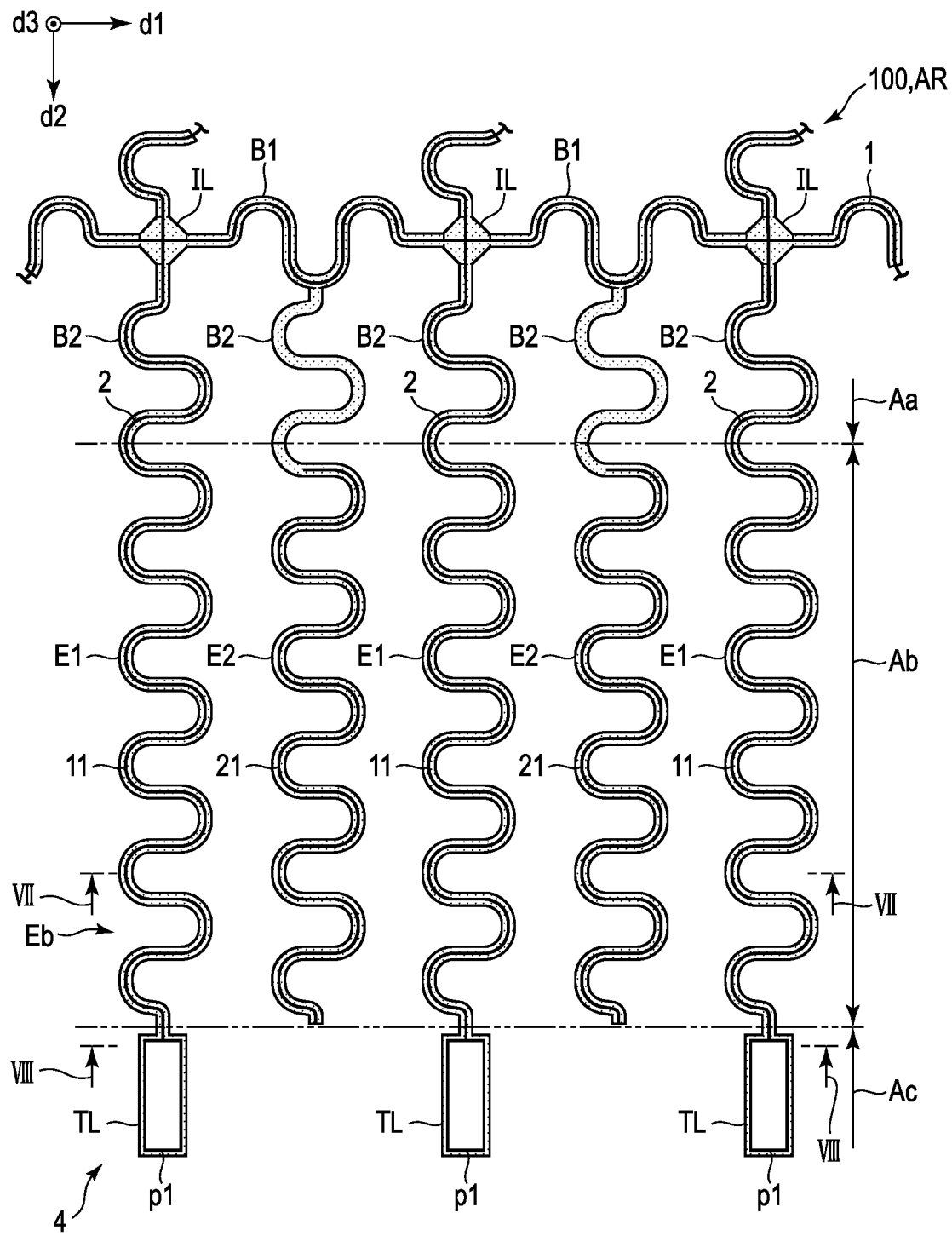
FIG. 6 is an enlarged plan view showing a lower side of the flexible substrate, illustrating a plurality of extending portions, a plurality of island-shaped portions, a plurality of routing lines, a plurality of dummy lines, and a plurality of pads.

Next, the areas Aa to Ac of the array substrate AR will be described. FIG. 6 is an enlarged plan view showing the lower side of the flexible substrate 100, illustrating a plurality of extending portions E1 and E2, a plurality of terminal portions TL, a plurality of routing lines 11, a plurality of dummy lines 21, and a plurality of pads p1.

As shown in FIG. 6, the area Aa and the area Ab are adjacent to each other in a second direction d2, and the area Ab and the area Ac are adjacent to each other in the second direction d2. As described above, the area Ab is located between the areas Aa and the area Ac. The insulating basement 4 further includes an extending portion Eb located in the area Ab and a plurality of terminal portions TL located in the area Ac.

The extending portion Eb includes a plurality of extending portions E1 and a plurality of extending portions E2. The extending portions E1 function as first extending portions, and the extending portions E2 function as second extending portions. Each of the plurality of extending portions E1 and E2 is located in the area Ab and is continuously formed from the area Aa. More specifically, the plurality of extending portions E1 and E2 are curved to extend, and have a corrugated shape in planar view, similarly to each of the bridge portions B1 and B2 in the area Aa.

Each of the extending portions E1 is formed continuously from one bridge portion B2 connected to the island-shaped portion IL. Each of the extending portions E2 is formed continuously from one bridge portion B2 connected to the bridge portion B1. In this embodiment, the extending portion E1 is indirectly connected to the island-shaped portion IL, but may be directly connected to the island-shaped portion IL. The extending portion E2 is indirectly connected to the bridge portion B1, but may be directly connected to the bridge portion B1. In addition, the plurality of extending portions E1 and the plurality of extending portions E2 are alternately arranged in the first direction d1 and are arranged separately from each other in the first direction d1.

The plurality of terminal portions TL are peripheral portions of the insulating basement 4. Each of the plurality of terminal portions TL is located in the area Ac. Each of the terminal portions TL is connected to a corresponding extending portion E1 among the plurality of extending portions E1. In this embodiment, the terminal portion TL is formed integrally with the extending portion E1. The terminal portion TL is not connected to the plurality of extending portions E2. The terminal portion TL functions as a second island-shaped portion.

The plurality of routing lines 11 are located in the area Ab, extend in the second direction d2, and are arranged at intervals in the first direction d1. Each of the routing lines 11 is provided on a corresponding extending portion E1 among the plurality of extending portions E1, and extends along the corresponding extending portion E1. In other words, the plurality of routing lines 11 are curved to extend, and have a corrugated shape in planar view, similarly to the plurality of extending portions E1. In addition, each of the routing lines 11 is electrically connected to a corresponding wiring line among a plurality of wiring lines located in the area Aa. In this embodiment, each of the routing lines 11 is electrically connected to the plurality of scanning lines 1 and a corresponding signal line 2 among the plurality of signal lines 2. In addition, in this embodiment, each of the routing lines 11 is formed integrally with the plurality of signal lines 2.

Each of the plurality of dummy lines 21 is located in the area Ab and extends in the second direction d2. Each of the dummy lines 21 is provided on a corresponding extending portion E2 among the plurality of extending portions E2, and extends along the corresponding extending portion E2. In other words, the plurality of dummy lines 21 are curved to extend, and have a corrugated shape in planar view, similarly to the plurality of extending portions E2. In this embodiment, each of the dummy lines 21 is located between two adjacent routing lines 11 among the plurality of routing lines 11. Each of the plurality of dummy lines 21 is electrically in a floating state and is not connected to the plurality of scanning lines 1 or the plurality of signal lines 2.

The plurality of pads p1 are located in the area Ac and are provided on a corresponding terminal portion TL among the plurality of terminal portions TL. Each of the plurality of pads p1 is electrically connected to a corresponding routing line 11 among the plurality of routing lines 11.

The case where the extending portions E1 and E2, the routing lines 11, and the dummy lines 21 are curved to extend has been described here. However, the extending portions E1 and E2, the routing lines 11, and the dummy lines 21 may not be curved to extend, but may be bent to extend.

Figure 7:
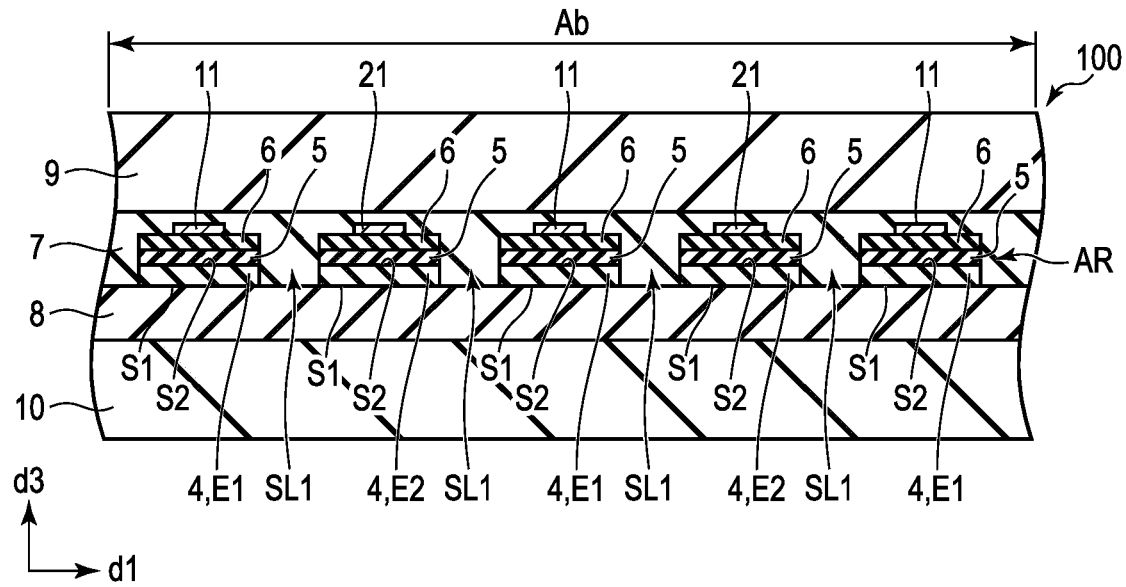
FIG. 7 is a cross-sectional view showing a part of the flexible substrate as viewed along line VII-VII in FIG. 6.

FIG. 7 is a cross-sectional view showing a part of the flexible substrate 100 as viewed along line VII-VII in FIG. 6. As shown in FIG. 7, each of the extending portions E1 and E2 constitutes a part of the first surface S1 and a part of the second surface S2. The routing lines 11 and the dummy lines 21 are provided on the second surface S2 side of the insulating basement 4. More specifically, the routing lines 11 are provided on the second surface S2 side of the extending portions E1 and are arranged on the organic insulating layer 6. The dummy lines 21 are provided on the second surface S2 side of the extending portions E2 and are arranged on the organic insulating layer 6.

The extending portions E1 and E2, the routing lines 11, and the dummy lines 21 also constitute the array substrate AR. In the area Ab, the array substrate AR includes a plurality of slits SL1 arranged in the first direction d1, and the organic insulating layer 7 and the organic insulating layer 8 are closely adhered to each other in the plurality of slits SL1.

Figure 8:
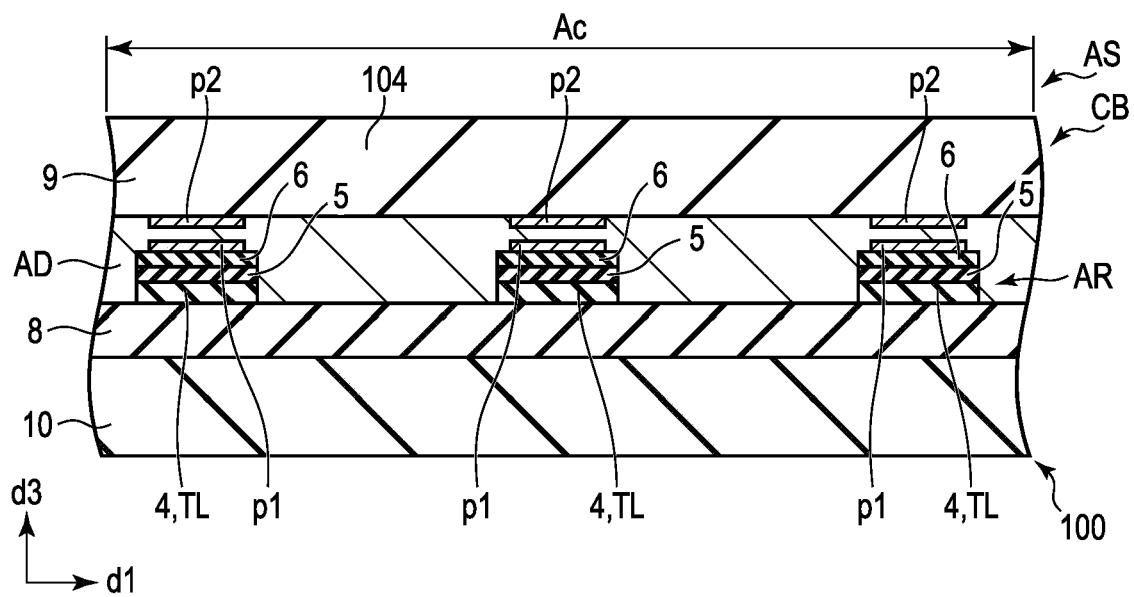
FIG. 8 is a cross-sectional view showing a part of the electronic device as viewed along line VIII-VIII in FIG. 6.

FIG. 8 is a cross-sectional view showing a part of the electronic device AS as viewed along line VIII-VIII in FIG. 6. As shown in FIG. 8, the terminal portions TL constitute a part of the first surface S1 and a part of the second surface S2. Each of the pads p1 is provided on the second surface S2 of the insulating basement 4. More specifically, each of the pads p1 is provided on the second surface S2 side of the terminal portion TL, and is disposed on the organic insulating layer 6. The terminal portions TL and the pads p1 also constitute the array substrate AR. The organic insulating layer 7 and the organic insulating layer 8 are closely adhered to each other in an area of the area Ac that is out of the plurality of terminal portions TL.

The wiring substrate CB includes an insulating basement 104, a plurality of pads p2, and the like. The insulating basement 104 is formed of, for example, polyimide, but is not limited to this example and may be formed of the other insulating material. Each of the pads p2 is opposed to a corresponding pad p1 among the plurality of pads p1.

The electronic device AS further comprises a connecting material AD. The connecting material AD is interposed between the flexible substrate 100 and the wiring substrate CB in the area Ac and is configured to connect the wiring substrate CB to the flexible substrate 100. The wiring substrate CB is mounted in the area Ac of the flexible substrate 100. In this embodiment, the connecting material AD is composed of anisotropic conductive film (ACF) which is a conductive material. The wiring substrate CB is electrically connected to the plurality of pads p1 via the connecting material AD and is physically fixed to the flexible substrate 100. Each of the pads p2 is electrically connected to a corresponding pad p1 among the plurality of pads p1 via the connecting material AD.

According to the electronic device AS of the first embodiment configured as described above, the flexible substrate 100 comprises an array substrate AR. The array substrate AR includes the insulating basement 4, the plurality of scanning lines 1, the plurality of signal lines 2, and the plurality of routing lines 11.

In the area Aa, the scanning lines 1 and the signal lines 2 do not extend linearly, but are curved to extend. In the area Ab, the routing lines 11 do not extend linearly, but are curved to extend. For this reason, the lines can contribute to improvement of the elasticity and flexibility of the areas Aa and Ab of the flexible substrate 100. Each of the organic insulating layers 7 to 9 is formed of a material having a lower coefficient of elasticity than the insulating basement 4. For this reason, the layers can contribute to improvement of the elasticity and flexibility of the flexible substrate 100.

In the area Aa, the plurality of scanning lines 1 and the plurality of signal lines 2 are provided in a grating pattern.

In this case, if only the routing lines 11 corresponding to the plurality of signal lines 2 are formed in the area Ab, the difference between the wiring density of the area Aa and the wiring density of the area Ab becomes large. Thus, when stress is applied to the flexible substrate 100, a local stress may be concentrated in the area where the wiring density is low, and a break may occur in the area where the wiring density is low.

Therefore, the array substrate AR further includes the plurality of dummy lines 21. The wiring density of the area Ab can be made closer to the wiring density of the area Aa by providing not only the plurality of routing lines 11 but also the plurality of dummy lines 21 in the area Ab. The degree of elongation of the area Aa and the area Ab of the flexible substrate 100 can be made uniform by equalizing the wiring density of the area Aa and the wiring density of the area Ab. As a result, a break in the area Aa and the area Ab can be suppressed. Alternatively, the rupture elongation can be improved.

In addition, the dummy lines 21 are curved to extend similarly to the scanning lines 1, the signal lines 2, and the routing lines 11. For this reason, the dummy lines 21 can contribute to the adjustment of the wiring density while contributing to the suppression of reduction in the elasticity and the flexibility of the flexible substrate 100.

The insulating basement 4 is formed only at positions where a plurality of wiring lines, electric elements, and the like are formed in the areas Aa, Ab, and Ac. In other words, the insulating basement 4 includes the plurality of openings OP1 in the area Aa and the plurality of slits SL1 in the areas Ab and Ac. For this reason, the insulating basement 4 can also contribute to the improvement of the elasticity and flexibility of the flexible substrate 100.

The insulating basement 4 includes a plurality of terminal portions TL located in the area Ac. The plurality of terminal portions TL are separated from each other. In other words, the plurality of terminal portions TL are disposed at intervals from each other. For this reason, the configuration can contribute to the improvement of the elasticity and flexibility of the flexible substrate 100 as compared with a case where the plurality of terminal portions TL are not separated.

Based on the above, the flexible substrate 100 having excellent flexibility and the electronic device AS comprising the flexible substrate 100 can be obtained.

Comparative Example 1

Next, a comparative example 1 will be described. The electronic device AS of the comparative example 1 is constituted similarly to the first embodiment except for constituent elements described in the comparative example 1. FIG. 9 is an enlarged plan view showing a lower side of the flexible substrate 100 according to comparative example 1, illustrating the plurality of extending portions E1, the plurality of terminal portions TL, the plurality of routing lines 11, and the plurality of pads p1. FIG. 10 is a cross-sectional view showing a part of the flexible substrate 100 as viewed along line X-X in FIG. 9.

As shown in FIG. 9 and FIG. 10, the array substrate AR has a configuration in which the extending portions E2 and the dummy lines 21 are not formed. For this reason, the extending portions E2 and the dummy lines 21 are not provided in the area Ab. In other words, the plurality of extending portions E1 are formed, but the plurality of extending portions E2 are not formed, in the area Ab.

The wiring density of the flexible substrate 100 according to the comparative example 1 will be described. FIG. 11 is a table showing the wiring density and the ratio difference under conditions of the flexible substrate 100 according to the comparative example 1.

As shown in FIG. 11, in the flexible substrate 100 of the condition 1 (sample 1), the wiring density of the area Aa was set to 0.17 µm²/µm and the wiring density of the area Ab was set to 0.14 µm²/µm. The ratio difference between the wiring density of the area Aa and the wiring density of the area Ab, under the condition 1, was 17%. The ratio difference can be obtained by the following formula 1.

(wiring density of area Aa–wiring density of area Ab)/wiring density of area Aa (Formula 1)

In contrast, in the flexible substrate 100 of the condition 2 (sample 2), the wiring density of the area Aa was 0.33 µm²/µm and the wiring density of the area Ab was 0.18 µm²/µm. The ratio difference between the wiring density of the area Aa and the wiring density of the area Ab, which was obtained by the formula 1, under the condition 2, was 45%.

When using the flexible substrate 100 having the ratio difference close to 50% similarly to the condition 2, stress is likely to be concentrated in the area Ab having a relatively low wiring density and a break may occur in the area Ab. For this reason, when the ratio difference of the wiring densities in the areas Aa and Ab is made as close to 0% as possible, there is no area where stress is concentrated and the possibility of a break to occur in any area can be suppressed.

Based on the above, a break may occur in the configuration of the comparative example 1. For this reason, it is desirable to provide the dummy lines 21 in the area Ab and make the ratio difference between the wiring densities in the areas Aa and Ab close to 0%, similarly to the first embodiment.

Second Embodiment

Next, a second embodiment will be described. An electronic device AS of the second embodiment is constituted similarly to the above-described first embodiment except for constituent elements described in the second embodiment. FIG. 12 is a plan view showing the electronic device AS according to the second embodiment.

As shown in FIG. 12, the organic insulating layer 8 is located not only in areas Aa to Ah but also in area Ai and the like. The area Ai is continuous from the areas Aa, Af, and Ag and is adjacent to the areas Aa, Af, and Ag in the first direction d1. The area Ai is located on the right side of the organic insulating layer 8. In the second embodiment, the area Aa is a first area, the area Ad is a second area, the area Ae is a third area, the area Af is a fourth area, the area Ag is a fifth area, and the area Ah is a sixth area. A direction in which the areas Aa, Af, and Ag are aligned intersects with a direction in which the areas Aa, Ad, and Ae are aligned.

In the direction in which the areas Aa, Ad, and Ae are aligned (first direction d1), a width Wd of the area Ad is larger than that in the first embodiment. In the second embodiment, the width Wd of the area Ad is larger than a width We of the area Ae in the first direction d1. For example, a length of the scanning lines 1 in the area Ad is larger than a width of the scanning line driver DR1, in the first direction d1. The width Wd is, for example, a distance from the electric element 3 located closest to the scanning line driver DR1 in the area Aa to the scanning line driver DR1. The width We is, for example, the width of the scanning line driver DR1.

In addition, a width Wf of the area Af is larger than that in the first embodiment in the direction in which the area Aa, the area Af, and the area Ag are aligned (second direction d2). In the second embodiment, the width Wf of the area Af is larger than the width Wg of the area Ag in the second direction d2. For example, the length of the signal line 2 in the area Af is larger than a width of a signal line driver DR2, in the second direction d2. The width Wf is, for example, a distance from the electric element 3 located closest to the signal line driver DR2 in the area Aa to the signal line driver DR2. A width Wg is, for example, the width of the signal line driver DR2.

In the second embodiment, the scanning lines 1 function as first lines, and the signal lines 2 function as second lines.

As described above, each of the distance of the first direction d1 from the area Aa to the scanning line driver DR1, and the distance of the second direction d2 from the area Aa to the signal line driver DR2 is secured as a constant or more length, in the second embodiment.

Next, the areas Aa, Ad, and Ae of the array substrate AR will be described. FIG. 13 is an enlarged plan view showing a left side of a flexible substrate 100 shown in FIG. 12, illustrating a plurality of extending portions E3 and E4, a strip-shaped portion Ba, a plurality of scanning lines 1, a plurality of dummy lines 22, and the scanning line driver DR1.

As shown in FIG. 13, an insulating basement 4 further includes an extending portion Ed located in the area Ad and a strip-shaped portion Ba located in the area Ae. The extending portion Ed includes a plurality of extending portions E3 and a plurality of extending portions E4. The extending portions E3 function as first extending portions, and the extending portions E4 function as second extending portions, in the second embodiment.

Each of the plurality of extending portions E3 is located in the area Ad, and is formed continuously from the area Aa toward the area Ae. More specifically, each of the extending portions E3 is formed continuously from a bridge portion B1 connected to an island-shaped portion IL1.

Each of the plurality of extending portions E4 is located in the area Ad, and is formed continuously from the area Aa toward the area Ae. More specifically, each of the extending portions E4 is formed continuously from a bridge portion B1 connected to a bridge portion B2. The plurality of extending portions E3 and E4 are curved to extend, and have a corrugated shape in planar view, similarly to each of the bridge portions B1 and B2 in the area Aa. In this embodiment, the plurality of extending portions E3 and the plurality of extending portions E4 are arranged alternately in the second direction d2.

The strip-shaped portion Ba is a peripheral portion of the insulating basement 4. The strip-shaped portion Ba is located in the area Ae. The strip-shaped portion Ba is formed continuously from the extending portions E3 and E4. In this embodiment, the strip-shaped portion Ba is formed integrally with the plurality of extending portions E3 and E4. The strip-shaped portion Ba functions as a first strip-shaped portion.

The plurality of scanning lines 1 are located in the areas Aa and Ad, extend in the first direction d1, and are arranged at intervals in the second direction d2. Each of the scanning lines 1 is provided on a corresponding extending portion E3 among the plurality of extending portions E3, and extends along the corresponding extending portion E3.

Each of the plurality of dummy lines 22 is located in the area Ad and extends in the first direction d1. Each of the dummy lines 22 is provided on a corresponding extending portion E4 among the plurality of extending portions E4, and extends along the corresponding extending portion E4. In the second embodiment, each of the dummy lines 22 is located between two adjacent scanning lines 1 among the plurality of scanning lines 1. The plurality of dummy lines 22 are curved to extend, and have a corrugated shape in planar view, similarly to each of the bridge portions B1 and B2 in the area Aa. Each of the plurality of dummy lines 22 is electrically in a floating state and is not connected to the plurality of scanning lines 1 or the plurality of signal lines 2.

The scanning line driver DR1 is located in the area Ae and is provided on the strip-shaped portion Ba. The scanning line driver DR1 is electrically connected to the plurality of scanning lines 1.

The case where the extending portions E3 and E4, and the scanning lines 1 in the area Ad and the dummy lines 22 are curved to extend has been described here. However, the extending portions E3 and E4, the scanning lines 1, and the dummy lines 22 may not be curved to extend, but may be bent and extend.

Next, the areas Aa, Af, and Ag of the array substrate AR will be described. FIG. 14 is an enlarged plan view showing an upper side of the flexible substrate 100 shown in FIG. 12, illustrating a plurality of extending portions E5 and E6, a strip-shaped portion Bb, a plurality of signal lines 2, a plurality of dummy lines 23, and the signal line driver DR2.

As shown in FIG. 14, the insulating basement 4 further includes extending portions Ef located in the area Af and the strip-shaped portion Bb located in the area Ag. The extending portions Ef include a plurality of extending portions E5 and a plurality of extending portions E6. In the second embodiment, the extending portions E5 function as third extending portions, and the extending portions E6 function as fourth extending portions.

Each of the plurality of extending portions E5 is located in the area Af, and is formed continuously from the area Aa toward the area Ag. More specifically, each of the extending portions E5 is formed continuously from a bridge portion B2 connected to the island-shaped portion IL1.

Each of the plurality of extending portions E6 is located in the area Af, and is formed continuously from the area Aa toward the area Ag. More specifically, each of the extending portions E6 is formed continuously from the bridge portion B2 connected to the bridge portion B1. The plurality of extending portions E5 and E6 are curved to extend, and have a corrugated shape in planar view, similarly to each of the bridge portions B1 and B2 in the area Aa. In the second embodiment, the plurality of extending portions E5 and the plurality of extending portions E6 are arranged alternately in the first direction d1.

The strip-shaped portion Bb is a peripheral portion of the insulating basement 4. The strip-shaped portion Bb is located in the area Ag. The strip-shaped portion Bb is formed continuously from the extending portions E5 and E6. In this embodiment, the strip-shaped portion Bb is formed integrally with the plurality of extending portions E5 and E6. The strip-shaped portion Bb functions as a second strip-shaped portion.

The plurality of signal lines 2 are located in the areas Aa and Af, extend in the second direction d2, and are arranged at intervals in the first direction d1. The plurality of signal lines 2 extend from the area Aa toward the area Ag. Each of the signal lines 2 is provided on a corresponding extending portion E5 among the plurality of extending portions E5, and extends along the corresponding extending portion E5.

Each of the plurality of dummy lines 23 is located in the area Af and extends in the second direction d2. Each of the dummy lines 23 is provided on a corresponding extending portion E6 among the plurality of extending portions E6, and extends along the corresponding extending portion E6. In the second embodiment, each of the dummy lines 23 is located between two adjacent signal lines 2 among the plurality of signal lines 2. The plurality of dummy lines 23 are curved to extend, and have a corrugated shape in planar view, similarly to each of the bridge portions B1 and B2 in the area Aa. Each of the plurality of dummy lines 23 is electrically in a floating state and is not connected to the plurality of scanning lines 1 or the plurality of signal lines 2.

The signal line driver DR2 is located in the area Ag and is provided on the strip-shaped portion Bb. The signal line driver DR2 is electrically connected to the plurality of signal lines 2.

The case where the extending portions E5 and E6, the signal lines 2 in the area Af, and the dummy lines 23 are curved to extend has been described here. However, the extending portions E5 and E6, the signal lines 2, and the dummy lines 23 may not be curved to extend, but may be bent to extend.

FIG. 15 is an enlarged plan view showing the upper left area Ah of the flexible substrate 100 shown in FIG. 12, illustrating a plurality of extending portions E7 and a plurality of lines 31.

As shown in FIG. 15, the insulating basement 4 further includes a plurality of extending portions E7 located in the area Ah. The plurality of extending portions E7 are curved to extend, and have a corrugated shape in planar view, similarly to each of the bridge portions B1 and B2 in the area Aa. In the second embodiment, the extending portions E7 function as fifth extending portions. Each of the extending portions E7 is continuous from at least one of the extending portion Ed, the strip-shaped portion Ba, the extending portion Ef, and the strip-shaped portion Bb. For example, the plurality of extending portions E7 are formed in a grating shape in the first direction d1 and the second direction d2. In the area Ah, the plurality of second portions OP2 of the insulating basement 4 are surrounded by the plurality of extending portions E7. The shape of the plurality of extending portions E7 in the area Ah is not limited to the example shown in FIG. 15, and can be variously deformed.

The array substrate AR includes a plurality of wiring lines 31 located in the area Ah. In the second embodiment, the wiring lines 31 function as third lines. The plurality of wiring lines 31 are provided on the plurality of extending portions E7 and extend along the plurality of extending portions E7. The plurality of wiring lines 31 are curved to extend, and have a corrugated shape in planar view, similarly to each of the bridge portions B1 and B2 in the area Aa. In the second embodiment, the plurality of wiring lines 31 include a plurality of first dummy lines extending in the first direction d1 and a plurality of second dummy lines extending in the second direction d2, and are each electrically in a floating state and are not connected to the plurality of scanning lines 1 or the plurality of signal lines 2.

However, the plurality of wiring lines 31 may be a plurality of routing lines. Alternatively, the plurality of wiring lines 31 may include both a plurality of routing lines and a plurality of dummy lines. Signals or voltages are supplied to the routing lines. For example, the routing lines are routing lines that connect the scanning line driver DR1 with the signal line driver DR2.

The case where the extending portions E7, and the wiring lines 31 in the area Ah are curved to extend has been described here. However, the extending portions E7 and the wiring lines 31 may not be curved and extend, but may be bent and extend.

As described above, the structure of the area Ah of the array substrate AR has been described with reference to FIG. 15. Although not shown, the structure of the area Ah of the array substrate AR is also applied to the structure of the area Ai of the array substrate AR (i.e., the structure on the right side). For example, the routing lines in the area Ai are connected to the scanning lines 1, the signal line driver DR2, and the like.

Figure 16:
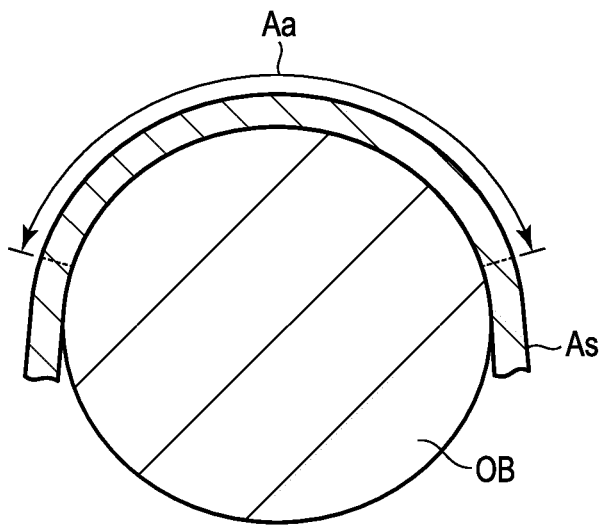
FIG. 16 is a cross-sectional view showing the electronic device according to the second embodiment and an object, illustrating a state in which the electronic device is attached to the object.
Figure 17:
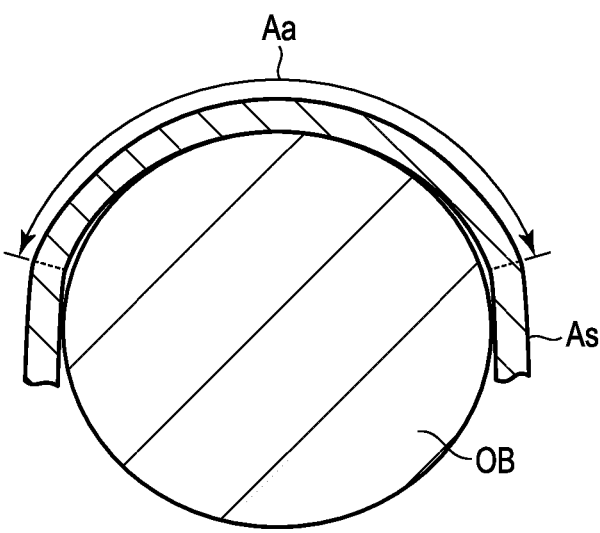
FIG. 17 is a cross-sectional view showing the electronic device according to the first embodiment and an object, illustrating a state in which the electronic device is attached to the object.

Next, differences between a case where the electronic device AS of the second embodiment is attached to a columnar object OB and a case where the electronic device AS of the first embodiment is attached thereto will be described. FIG. 16 is a cross-sectional view showing the electronic device AS according to the second embodiment and the object OB, illustrating a state in which the electronic device AS is attached to the object OB. FIG. 17 is a cross-sectional view showing the electronic device AS according to the first embodiment and the object OB, illustrating a state in which the electronic device AS is attached to the object OB.

As shown in FIG. 16, in the second embodiment, the scanning line driver DR1 and the signal line driver DR2 are not close to the area Aa as compared with the first embodiment. In other words, the area having excellent flexibility and elasticity continues not only to the area Aa but also to the areas Ad, Af, Ai, and Ah around the area Aa. For this reason, in the second embodiment, the entire area Aa of the electronic device AS can be desirably brought into close contact with the object OB. For example, when the area Aa is a sensing area, the object OB can be desirably sensed in the entire area Aa.

In contrast, as shown in FIG. 17, in the first embodiment, the scanning line driver DR1 and the signal line driver DR2 are closer to the area Aa as compared with the second embodiment. In other words, the area excellent in flexibility and elasticity is only the area Aa, and the area around the area Aa becomes difficult to bend. For this reason, in the first embodiment, the end portion of the area Aa of the electronic device AS is affected by the difficulty of bending the surrounding of the area Aa, the entire area Aa cannot be desirably brought into close contact with the object OB, and a part of the area Aa becomes in a state of floating from the object OB. For example, when the area Aa is a sensing area, the object OB can hardly be desirably sensed in a part of the area Aa. In addition, since distances between the plurality of electric elements 3 and the object OB become non-uniform, the sensing accuracy may decrease.

According to the electronic device AS of the second embodiment configured as described above, the flexible substrate 100 comprises the array substrate AR. The array substrate AR includes the insulating basement 4, the plurality of scanning lines 1, the plurality of signal lines 2, and the scanning line driver DR1.

In the area Aa, the scanning lines 1 and the signal lines 2 do not extend linearly, but are curved to extend. In the area Ad, the scanning lines 1 do not extend linearly, but are curved and extend. In the area Af, the scanning lines 2 do not extend linearly, but are curved and extend. For this reason, the scanning lines 1 and the signal lines 2 can contribute to improvement of the elasticity and flexibility of the areas Aa, Ad, and Af of the flexible substrate 100. Each of the organic insulating layers 7 to 9 is formed of a material having a lower coefficient of elasticity than the insulating basement 4. For this reason, the layers can contribute to improvement of the elasticity and flexibility of the flexible substrate 100.

The width Wd of the area Ad is larger than the width We of the area Ae. In addition, the width Wf of the area Af is larger than the width Wg of the area Ag. For this reason, the covering property of the object OB in the area Aa can be improved.

In the area Ad, not only the plurality of scanning lines 1 but also a plurality of dummy lines 22 are provided. In the area Af, not only the plurality of signal lines 2 but also a plurality of dummy lines 23 are provided. Furthermore, a plurality of lines 31 are also arranged in the areas Ah and Ai. As a result, the degree of elongation of the area Aa, area Ab, area Ad, area Af, area Ah, and area Ai of the flexible substrate 100 can be made uniform, and a break can be suppressed.

Based on the above, the flexible substrate 100 having excellent flexibility and the electronic device AS comprising the flexible substrate 100 can be obtained.

The array board AR may have a configuration in which the plurality of extending portions E4 and the plurality of dummy lines 22 are not formed. Alternatively, the array substrate AR may have a configuration in which the plurality of extending portions E6 and the plurality of dummy lines 23 are not formed. Alternatively, the array substrate AR may have a configuration in which the plurality of extending portions E4 and E6 and the plurality of dummy lines 22 and 23 are not formed.

Third Embodiment

Figure 18:
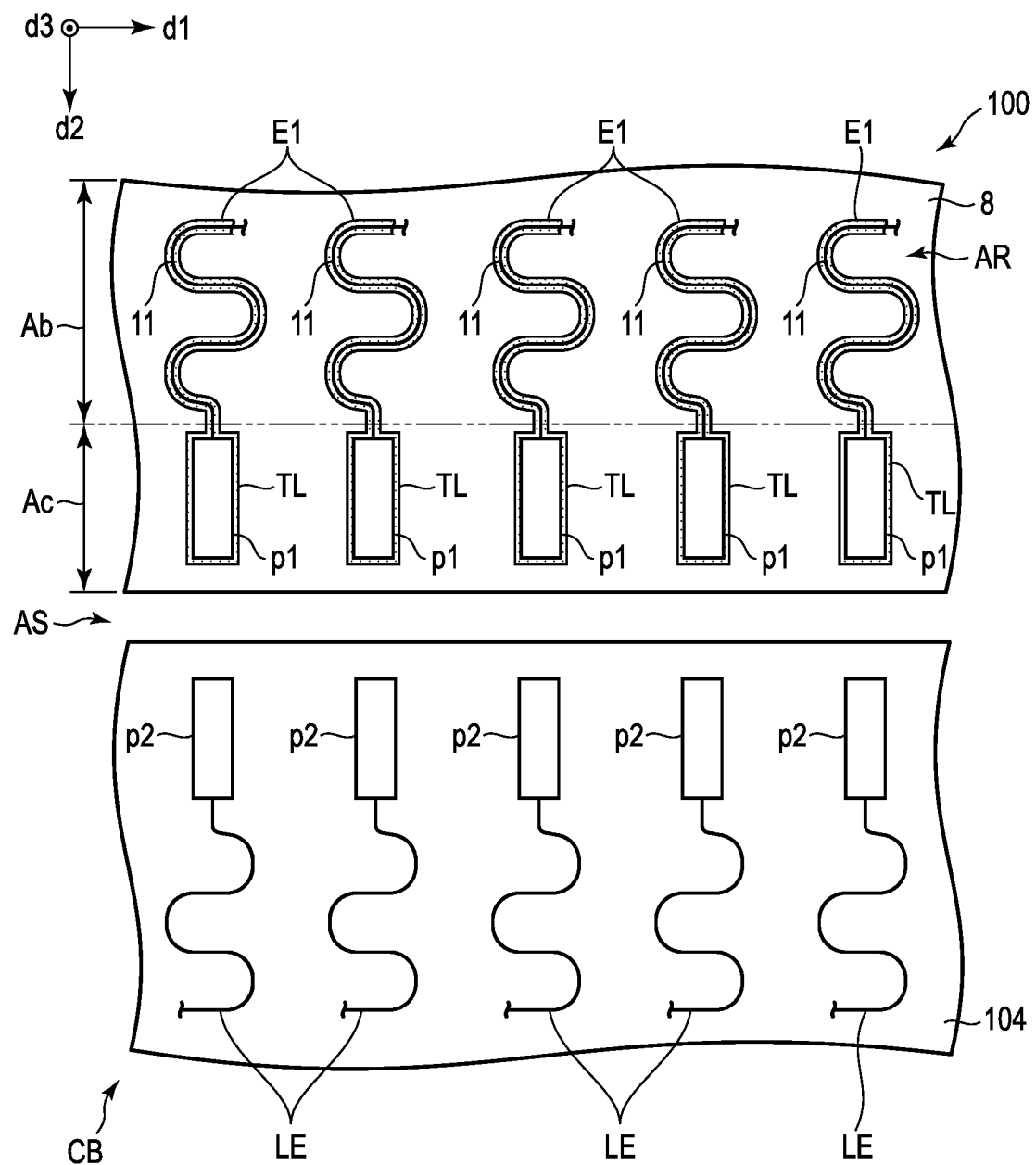
FIG. 18 is a plan view showing a part of an electronic device according to a third embodiment, illustrating a flexible substrate and a wiring substrate in an exploded manner.

Next, a third embodiment will be described. An electronic device AS of the third embodiment is constituted similarly to the first embodiment except for constituent elements described in the third embodiment. FIG. 18 is a plan view showing a part of the electronic device AS according to the third embodiment, illustrating a flexible substrate 100 and a wiring substrate CB in an exploded manner.

As shown in FIG. 18, the flexible substrate 100 comprises an array substrate AR and an organic insulating layer 8. The array substrate AR includes an insulating basement 4, a plurality of routing lines 11, and a plurality of pads p1. In the third embodiment, the insulating basement 4 functions as a first insulating basement, and the pads p1 function as first pads. The organic insulating layer 8 is closely adhered to the array substrate AR.

The insulating basement 4 includes a plurality of extending portions E1 and a plurality of terminal portions TL. In the third embodiment, the extending portions E1 function as first extending portions. The plurality of extending portions E1 are curved and extend. Each of the terminal portions TL is continuous from a corresponding extending portion E1 among the plurality of extending portions E1.

Each of the routing lines 11 extends in the second direction d2. Each of the routing lines 11 is provided on a corresponding extending portion E1 among the plurality of extending portions E1, and extends along the corresponding extending portion E1. Each of the pads p1 is provided on a corresponding terminal portion TL among the plurality of terminal portions TL, and is electrically connected to a corresponding routing line 11 among the plurality of routing lines 11.

The wiring substrate CB includes an insulating basement 104, a plurality of lead lines LE, and a plurality of pads p2. In the third embodiment, the insulating basement 104 functions as a second insulating basement, and the pads p2 function as second pads. Each of the lead lines LE is provided on the insulating basement 104 and extends in the second direction d2. The lead line LE has a corrugated shape in planar view, similarly to the scanning lines 1 and the signal lines 2. Each of the pads p2 is electrically connected to a corresponding lead line LE among the plurality of lead lines LE.

The case where the extending portions E1, the routing lines 11, and the lead lines LE are curved and extend has been described here. However, the extending portions E1, the routing lines 11, and the lead lines LE may not be curved and extend, but may be bent and extend.

Figure 19:
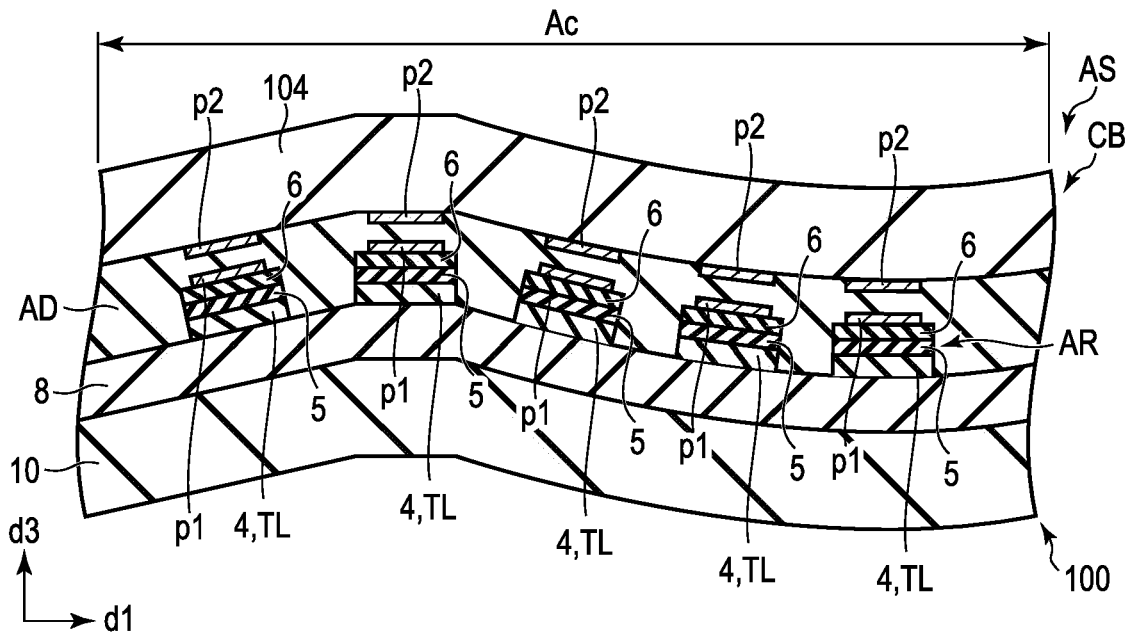
FIG. 19 is a cross-sectional view showing a part of the electronic device according to the third embodiment, illustrating a connecting portion between the flexible substrate and the wiring substrate.

FIG. 19 is a cross-sectional view showing a part of the electronic device AS according to the third embodiment, illustrating a connecting portion between the flexible substrate 100 and the wiring substrate CB. In the third embodiment, the insulating basement 4 is formed of, for example, polyimide. Each of the organic insulating layer 8, the organic insulating layer 10, and the insulating basement 104 is formed of a material having a lower coefficient of elasticity than the insulating basement 4.

As shown in FIG. 19, the connecting material AD is interposed between the flexible substrate 100 and the wiring substrate CB in the area Ac and is configured to connect the wiring substrate CB to the flexible substrate 100. Each of the pads p2 is opposed to a corresponding pad p1 among the plurality of pads p1 and is electrically connected to the corresponding pad p1 via the connecting material AD.

The insulating basement 104 is formed of a material having a lower coefficient of elasticity than the insulating basement 4. In addition, the insulating basement 104 is formed of the same material as the organic insulating layers 8 and 10 that support the insulating basement 4. In other words, the insulating basement 104 is formed of, for example, any of the above-mentioned acrylic, urethane, and epoxy resins. For this reason, the insulating basement 104 is excellent in flexibility and elasticity. As shown in FIG. 19, the insulating basement 104 is formed to extend parallel to the organic insulating layers 8 and 10 in the area Ac which overlaps with the connecting material AD.

Comparative Example 2

Figure 20:
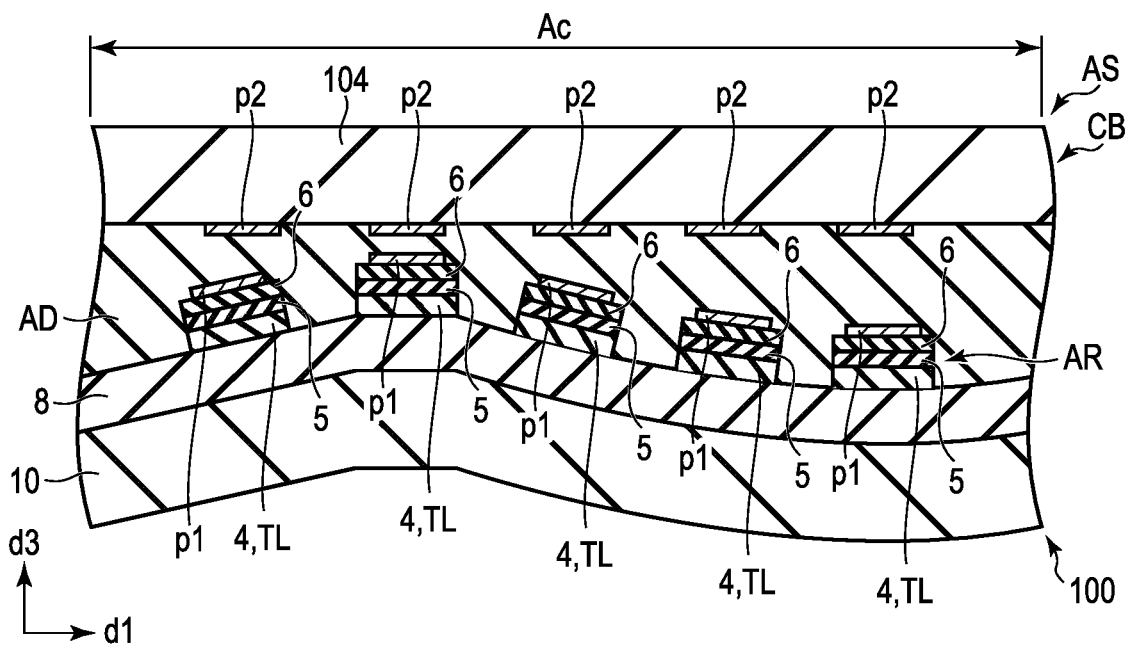
FIG. 20 is a cross-sectional view showing a part of the electronic device according to a comparative example 2, illustrating a connecting portion between the flexible substrate and the wiring substrate.

Next, a comparative example 2 will be described. The electronic device AS of the comparative example 2 is constituted similarly to the above third embodiment except for constituent elements described in the comparative example 2. FIG. 20 is a cross-sectional view showing a part of the electronic device AS according to the comparative example 2, illustrating a connecting portion between the flexible substrate 100 and the wiring substrate CB.

The insulating basement 104 of the comparative example 2 is formed of the same material as the insulating basement 4, for example, polyimide. In the comparative example 2, the coefficient of elasticity of the material forming the insulating basement 104 is the same as the coefficient of elasticity of the material forming the insulating basement 4, and is higher than the coefficient of elasticity of the material forming the organic insulating layers 7 to 10. In other words, for example, the insulating basement 104 does not have as flexibility as the organic insulating layer 8.

As shown in FIG. 20, the wiring substrate CB has less flexibility than the flexible substrate 100, and its shape is unlikely to change. For this reason, when the wiring substrate CB is mounted on the distorted flexible substrate 100, the pads p1 and the pads p2 may be connected with the positions shifted, and connection failures may occur at the pads p1 and the pads p2. In other words, in the wiring substrate CB in the comparative example 2, it is difficult to arrange the pads p1 and the pads p2 in parallel. For this reason, it becomes difficult to suppress the displacement of the pads p2 from the pads p1, and mounting failures of the wiring substrate CB on the flexible substrate 100 occur.

Based on the above, the insulating basement 104 of the wiring substrate CB according to the third embodiment is formed of a material having a lower coefficient of elasticity than the insulating basement 4 of the flexible substrate 100. The insulating basement 104 is excellent in flexibility and elasticity as compared with the comparative example 2. For this reason, as shown in FIG. 19, even when the wiring substrate CB is mounted on the area Ac of the flexible substrate 100 in which the distortion has occurred, the wiring substrate CB is made to have a shape following to the shape of the area Ac of the flexible substrate 100, and the pads p1 and the pads p2 can be disposed in a state of being parallel to each other. In other words, since the displacement of the pads p2 from the pads p1 can be suppressed, the mounting failure of the wiring substrate CB to the flexible substrate 100 can hardly be made to occur.

In addition, the lead lines LE do not extend linearly, but curve and extend. For this reason, the elasticity and flexibility of the flexible substrate 100 can be improved, and the elasticity and flexibility of the wiring substrate CB can be improved with the lead lines LE.

Based on the above, the flexible substrate 100 having excellent flexibility and the electronic device AS comprising the flexible substrate 100 can be obtained.

Modified Example

Figure 21:
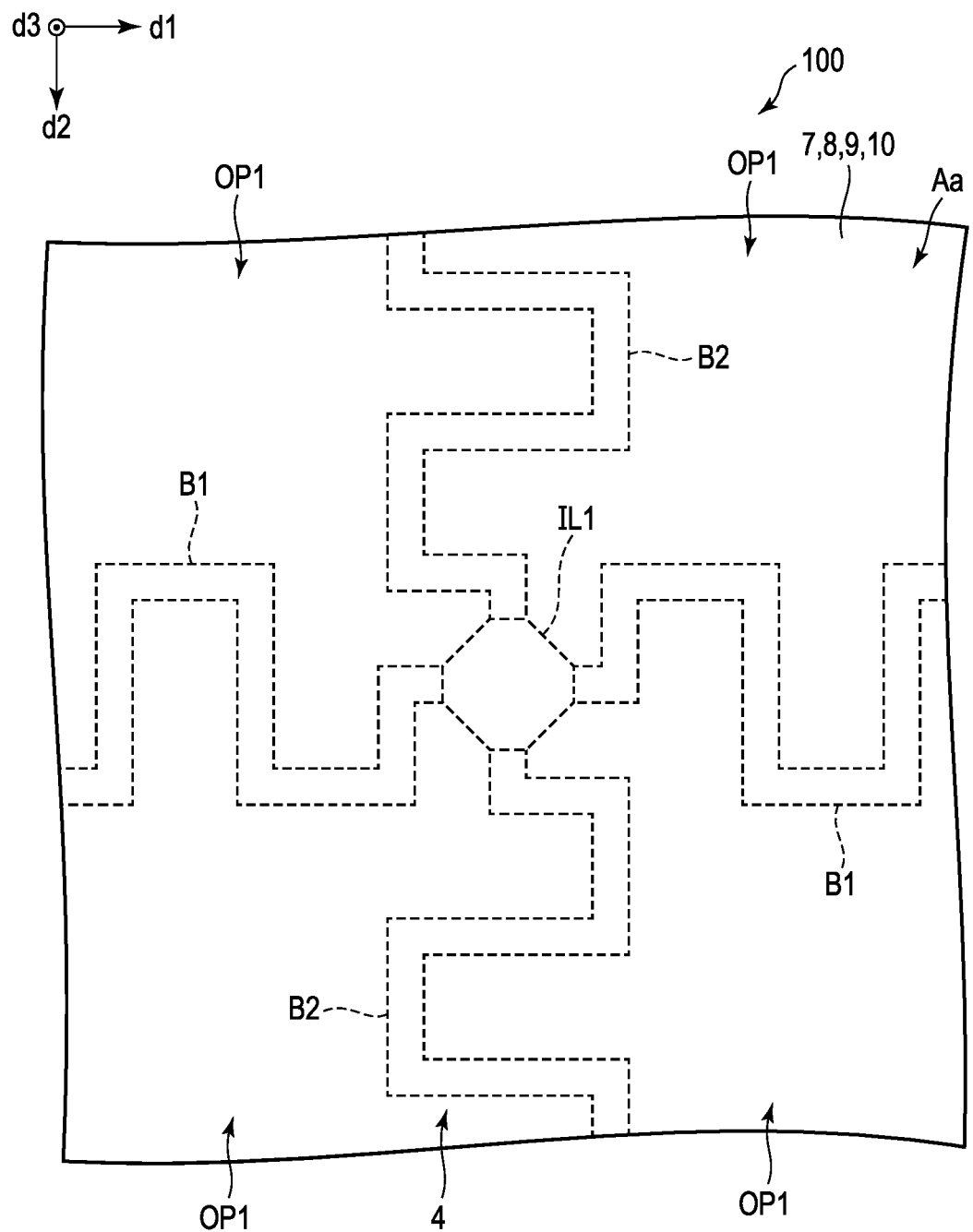
FIG. 21 is an enlarged plan view showing a part of the flexible substrate according to a modified example.

Next, a modified example of the first embodiment will be described. FIG. 21 is an enlarged plan view showing a part of the flexible substrate 100 according to the modified example.

As shown in FIG. 21, in this modified example, the plurality of bridge portions B1 and the plurality of bridge portions B2 extend while being bent. Although not shown, each of the scanning lines 1 extends along the bridge portion B1 while being bent, and each of the signal lines 2 extends along the bridge portion B2 while being bent. The flexible substrate 100 of this modified example is configured in the same manner as the above first embodiment except for the above-described elements.

In this modified example, the same advantages as the above-described first embodiment can also be obtained. In addition, the modified example can also be applied to the second embodiment and the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the dummy lines 21, the dummy lines 22, the dummy lines 23, and the wiring lines 31 that function as the dummy lines do not need to extend continuously, but may extend intermittently.

What is claimed is:

1. An electronic device comprising:
a flexible substrate; and a wiring substrate,
the flexible substrate comprising:
- a first insulating basement including an island-shaped portion, a bridge portion, and an extending portion; and
- a routing line provided on the first insulating basement and extending in a second direction, the island-shaped portion including a first island-shaped portion and a second island-shaped portion disposed parallel to the first island-shaped portion in a first direction, the bridge portion extending in the first direction and connecting the first island-shaped portion with the second island-shaped portion, the extending portion including a first extending portion which is connected to the first island-shaped portion and extends in the second direction intersecting the first direction, and a second extending portion which is connected to the bridge portion and extends in the second direction, the first insulating basement including a peripheral portion, the first extending portion being connected to the peripheral portion, the peripheral portion being a terminal portion, the routing line being provided on the first extending portion and connected to a pad formed on the terminal portion, the wiring substrate being mounted on the terminal portion, the wiring substrate including a second insulating basement, a lead line, and a second pad electrically connected to the lead line, the flexible substrate and the wiring substrate being connected to each other via a connecting material, and the second insulating basement being formed of a material having a lower coefficient of elasticity than the first insulating basement.

\* \* \* \* \*